United States Patent
Liu et al.

(10) Patent No.: US 8,810,313 B2
(45) Date of Patent: Aug. 19, 2014

(54) MULTI-BAND POWER AMPLIFIER

(75) Inventors: Linsheng Liu, Chengdu (CN); Xiaochuan Jiang, Chengdu (CN)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 13/704,040

(22) PCT Filed: Jun. 29, 2010

(86) PCT No.: PCT/CN2010/000971
§ 371 (c)(1),
(2), (4) Date: Dec. 13, 2012

(87) PCT Pub. No.: WO2012/000129
PCT Pub. Date: Jan. 5, 2012

(65) Prior Publication Data
US 2013/0088295 A1   Apr. 11, 2013

(51) Int. Cl.
*H03F 3/68* (2006.01)
*H03F 3/24* (2006.01)
*H03F 3/193* (2006.01)
*H03F 3/189* (2006.01)
*H03F 3/19* (2006.01)
*H03F 1/02* (2006.01)
*H03F 3/21* (2006.01)

(52) U.S. Cl.
CPC .................. *H03F 3/21* (2013.01); *H03F 3/245* (2013.01); *H03F 2200/423* (2013.01); *H03F 2200/15* (2013.01); *H03F 2200/204* (2013.01); *H03F 3/193* (2013.01); *H03F 3/189* (2013.01); *H03F 3/19* (2013.01); *H03F 1/0266* (2013.01)
USPC .......................................... 330/126; 330/302

(58) Field of Classification Search
CPC ..................... H03F 2200/111; H03F 2200/372; H03F 2200/294; H03F 3/68; H03F 3/211
USPC .................. 330/250–251, 302, 285, 296, 126
See application file for complete search history.

(56) References Cited

U.S. PATENT DOCUMENTS

| 5,995,814 A | 11/1999 | Yeh |
| 6,724,255 B2 | 4/2004 | Kee et al. |

(Continued)

FOREIGN PATENT DOCUMENTS

| WO | 02073794 A2 | 9/2002 |
| WO | 2010024746 A1 | 3/2010 |

OTHER PUBLICATIONS

Lepine, et al., "L-Band LDMOS Power Amplifiers Based on an Inverse Class-F Architecture", IEEE Transactions on Microwave Theory and Techniques, Jun. 2005, vol. 53, No. 6.

(Continued)

*Primary Examiner* — Hieu Nguyen
(74) *Attorney, Agent, or Firm* — Coats & Bennett, P.L.L.C.

(57) ABSTRACT

A power amplifier (20) for operation in at least a first and a second frequency band, wherein a center frequency $f_2$ of the second frequency band is higher than a center frequency $f_1$ of the first frequency band, is disclosed. The power amplifier (20) comprises a transistor (35) for amplifying an input signal of the power amplifier (20) and an output coupling network (45) for connecting the power amplifier to a resistive load (55). The output coupling network (45) is operatively connected to an output terminal (40) of the transistor (35), has an output terminal (50) for connection to said resistive load (55), and is configured such that, when the power amplifier (20) is connected to said resistive load (55), the power amplifier (20) is arranged to operate in class F for frequencies in one of the first and the second frequency bands, and operate in inverse class F for frequencies in the other one of the first and the second frequency band. A related radio transmitter circuit (10) and a related radio-communication apparatus (1,2) are also disclosed.

16 Claims, 12 Drawing Sheets

(56) References Cited

U.S. PATENT DOCUMENTS

| | | | |
|---|---|---|---|
| 7,092,691 | B2 | 8/2006 | Bohn et al. |
| 7,646,248 | B2 | 1/2010 | Yang et al. |
| 8,576,004 | B2 * | 11/2013 | Dupuy et al. .......... 330/126 |
| 2008/0191801 | A1 | 8/2008 | Kim et al. |
| 2008/0252382 | A1 | 10/2008 | Takagi |

OTHER PUBLICATIONS

Gao, S., Butterworth, S., Ooi, S., and Sambell, A.; "High-Efficiency Power Amplifier Design Including Input Harmonic Termination", IEEE Microwave and Wireless Components Letters, Feb. 2005, pp. 81-83; vol. 16, No. 2.

Ji, Seung Hun, Cho, Choon Sik, Lee, Jae W., Kim, Jaeheung; "Concurrent Dual-Band Class-E Power Amplifier Using Composite Right/Left-Handed Transmission Lines", IEEE Transactions on Microwave Theory and Techniques, Jun. 2007, pp. 1341-1347; vol. 55, No. 6.

Negra, Renalto, Sadevde, Alexandre, Bensmida, Souheil, Ghannouchi, Fadhel M.; "Concurrent Dual-Band Class-F Load Coupling Network for Applications at 1.7 and 2.14 GHz", IEEE Transactions on Circuits and Systems—II: Express Briefs. Mar. 2008, pp. 259-263; vol. 55, No. 3.

Bohn, Florian, Kee, Scott, Hajimiri, Ali; "Demonstration of a Switchless Class E/F odd Dual-Band Power Amplifier" Department of Electrical Engineering, TH2D-2, 2002 IEEE MTTS-S Digest, pp. 1631-1634; California Institute of Technology, Pasadena, CA 91125.

Fukuda, A., Okazaki, Hiroshi, Hirota, Tesuo; Yamao, Yasushi; "Novel 900 MHz/1.9 GHz Dual-Mode Power Amplifier Employing MEMS Switches for Optimum Matching", IEEE Microwave and Wireless Components Letters, Mar. 2004, pp. 121-123; vol. 14, No. 3.

\* cited by examiner

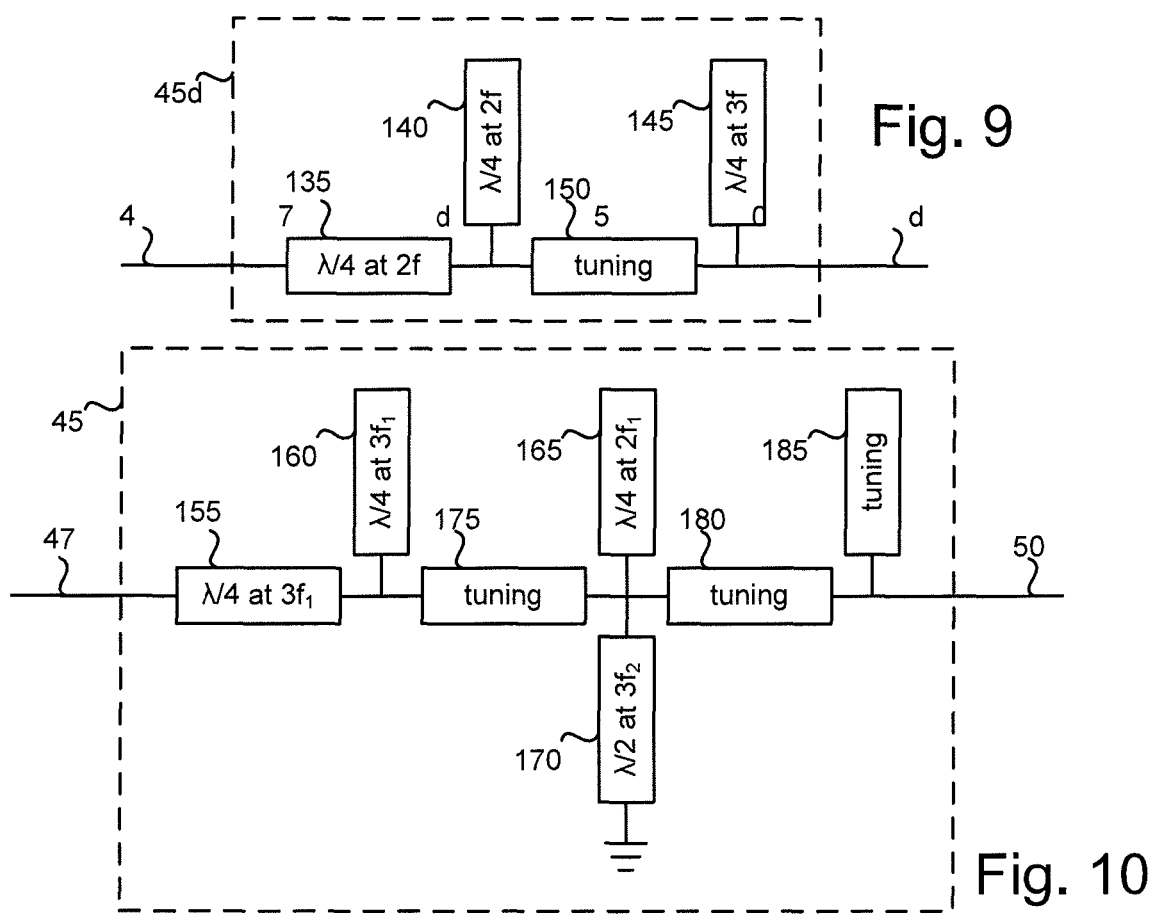
Fig. 9
Fig. 10
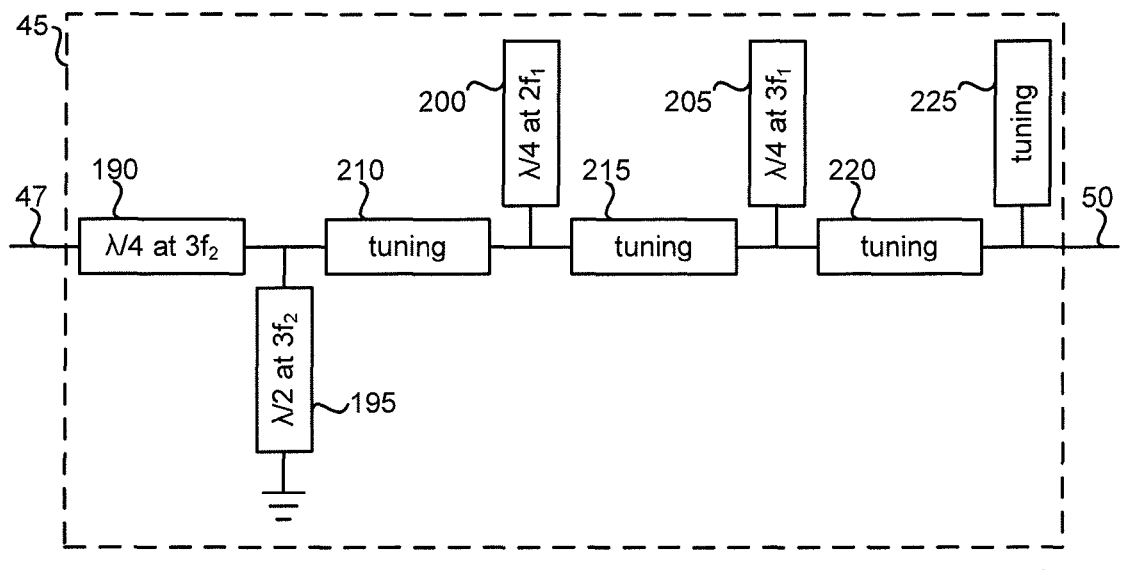
Fig. 11

MULTI-BAND POWER AMPLIFIER

TECHNICAL FIELD

The present invention relates to a power amplifier for operation in multiple frequency bands.

BACKGROUND

Various types of equipment for use in radio communication systems, such as cellular radio communication systems, may be provided with capability of transmitting data in a plurality of different frequency bands. Examples of such equipment are e.g. mobile phones and radio base stations. It is desirable that such equipment is capable of switching smoothly between operation in different frequency bands and in accordance with different standards and specifications.

One component that is important in this aspect is the power amplifier, which is used for feeding one or more transmitting antennas with an electric signal having a relatively high power level. One solution for enabling transmission in different frequency bands is to use multiple single-band power amplifiers and corresponding transmission filters, and select which one of the single-band power amplifiers and corresponding transmission filter that is currently used in accordance with the frequency band to be used using switches. However, such a solution is relatively costly, e.g. in terms of required circuit area. Hence, a simpler and less costly solution is desirable.

SUMMARY

An object of the present invention is to provide a power amplifier capable of operation in a plurality of frequency bands.

According to a first aspect, there is provided a power amplifier for operation in at least a first and a second frequency band, wherein a center frequency $f_2$ of the second frequency band is higher than a center frequency $f_1$ of the first frequency band. The power amplifier comprises a transistor for amplifying an input signal of the power amplifier. Furthermore, the power amplifier comprises an output coupling network for connecting the power amplifier to a resistive load. The output coupling network is operatively connected to an output terminal of the transistor, has an output terminal for connection to said resistive load, and is configured such that, when the power amplifier is connected to said resistive load, the power amplifier is arranged to operate in class F for frequencies in one of the first and the second frequency bands, and operate in inverse class F for frequencies in the other one of the first and the second frequency band.

The ratio between the center frequency $f_2$ of the second frequency band and the center frequency $f_1$ of the first frequency band may be 1.5.

In embodiments where the power amplifier is arranged for operation in class F for frequencies in the first frequency band and for operation in inverse class F for frequencies in the second frequency band, the output coupling network may be adapted to, when the power amplifier is connected to said resistive load, provide an essentially lossless electrical connection between the output terminal of the transistor and the resistive load at the frequencies $f_1$ and $f_2$, provide an open circuit between the output terminal of the transistor and the resistive load at the frequency $3f_1=2f_2$, and provide a short circuit between the output terminal of the transistor and a reference-voltage node at the frequencies $2f_1$ and $3f_2$.

For example, the output coupling network may comprise a first parallel-LC resonance circuit operatively connected between the output terminal of the transistor and the output terminal of the output coupling network and adapted to resonate at the frequency $3f_1=2f_2$ for providing said open circuit at $3f_1=2f_2$, and a branch operatively connected between the output terminal of the output coupling network and the reference-voltage node, comprising a second parallel-LC resonance circuit and a third parallel-LC resonance circuit, connected in series with the second parallel-LC resonance circuit. The second parallel-LC resonance circuit may be adapted to resonate at the frequency $f_1$ and the third parallel-LC resonance circuit may be adapted to resonate at the frequency $f_2$ for providing said essentially lossless electrical connection between the output terminal of the transistor and the resistive load at frequencies $f_1$ and $f_2$ and said short circuit between the output terminal of the transistor and the reference-voltage node at the frequencies $2f_1$ and $3f_2$.

Alternatively, the output coupling network may comprise transmission lines adapted to provide said essentially lossless electrical connection at the frequencies $f_1$ and $f_2$, said open circuit at the frequency $3f_1=2f_2$, and said short circuit at the frequencies $2f_1$ and $3f_2$.

In embodiments where the power amplifier is arranged for operation in inverse class F for frequencies in the first frequency band and for operation in class F for frequencies in the second frequency band, the output coupling network may be adapted to, when the power amplifier is connected to said resistive load, provide an essentially lossless electrical connection between the output terminal of the transistor and the resistive load at the frequencies $f_1$ and $f_2$, provide an open circuit between the output terminal of the transistor and the resistive load at the frequencies $2f_1$ and $3f_2$, and provide a short circuit between the output terminal of the transistor and a reference-voltage node at the frequency $3f_1=2f_2$.

For example, the output coupling network may comprise a first series-LC resonance circuit operatively connected between the output terminal of the transistor and a reference voltage node and adapted to resonate at the frequency $3f_1=2f_2$ for providing said short circuit at the frequency $3f_1=2f_2$, and a branch operatively connected between the output terminal of the transistor and the output terminal of the output coupling network, comprising a second series-LC resonance circuit and a third series-LC resonance circuit, connected in parallel with the second series-LC resonance circuit. The second series-LC resonance circuit may be adapted to resonate at the frequency $f_1$ and the third series-LC resonance circuit may be adapted to resonate at the frequency $f_2$ for providing said essentially lossless electrical connection between the output terminal of the transistor and the resistive load at frequencies $f_1$ and $f_2$ and said open circuit between the output terminal of the transistor and the resistive load at the frequencies $2f_1$ and $3f_2$.

Alternatively, the output coupling network may comprise transmission lines adapted to provide said essentially lossless electrical connection at the frequencies $f_1$ and $f_2$, said open circuit at the frequencies $2f_1$ and $3f_2$, and said short circuit at the frequency $3f_1=2f_2$.

The power amplifier may be further arranged for operation in an additional third frequency band, wherein a center frequency $f_3$ of the third frequency band is higher than the center frequency $f_2$ of the second frequency band. The output coupling network may be configured such that, when the power amplifier is connected to said resistive load, the power amplifier is arranged to operate in the same class for frequencies in the third frequency band as for frequencies in the first frequency band.

Furthermore, the power amplifier may be further arranged for operation in an additional fourth frequency band, wherein a center frequency $f_4$ of the fourth frequency band is higher than the center frequency $f_3$ of the third frequency band. The output coupling network may be configured such that, when the power amplifier is connected to said resistive load, the power amplifier is arranged to operate in the same class for frequencies in the fourth frequency band as for frequencies in the second frequency band.

The ratio between the center frequency $f_4$ of the fourth frequency band and the center frequency $f_3$ of the third frequency band may be 1.5.

In embodiments where the power amplifier is arranged for operation in class F for frequencies in the first frequency band and for operation in inverse class F for frequencies in the second frequency band, the output coupling network may be adapted to, when the power amplifier is connected to said resistive load, provide an essentially lossless electrical connection between the output terminal of the transistor and the resistive load at the frequencies $f_3$ and $f_4$, provide an open circuit between the output terminal of the transistor and the resistive load at the frequency $3f_3=2f_4$, and provide a short circuit between the output terminal of the transistor and a reference-voltage node at the frequencies $2f_3$ and $3f_4$.

In embodiments where the power amplifier is arranged for operation in inverse class F for frequencies in the first frequency band and for operation in class F for frequencies in the second frequency band, the output coupling network may be adapted to, when the power amplifier is connected to said resistive load, provide an essentially lossless electrical connection between the output terminal of the transistor and the resistive load at the frequencies $f_3$ and $f_4$, provide an open circuit between the output terminal of the transistor and the resistive load at the frequencies $2f_3$ and $3f_4$, and provide a short circuit between the output terminal of the transistor and a reference-voltage node at the frequency $3f_3=2f_4$.

The ratio between the center frequency $f_3$ of the third frequency band and the center frequency $f_2$ of the second frequency band may be 1.5.

According to a second aspect, there is provided a radio-transmitter circuit comprising the power amplifier according to the first aspect.

According to a third aspect, there is provided a radio-communication apparatus comprising the radio transmitter circuit according to the second aspect. The radio-communication apparatus may e.g. be, but is not limited to, a mobile phone or a radio base station.

Further embodiments of the invention are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which:

FIGS. 4-17 are schematic circuit diagrams of output coupling networks according to elucidating examples and embodiments of the present invention;

DETAILED DESCRIPTION

Figure 1:
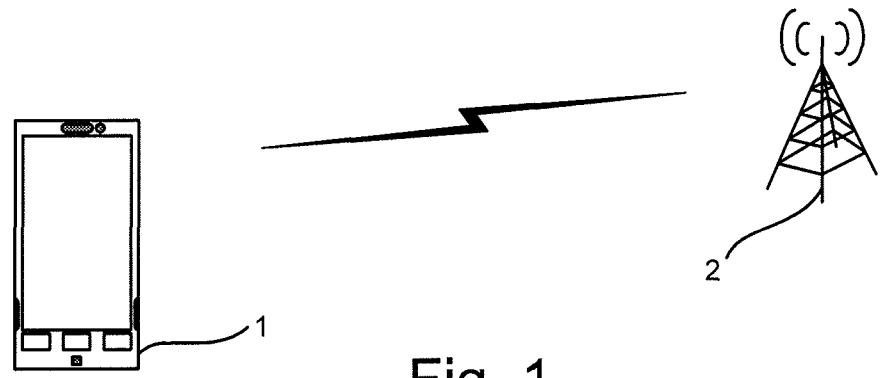
FIG. 1 schematically illustrates a mobile terminal in communication with a radio base station.

FIG. 1 illustrates schematically an environment where embodiments of the present invention may be employed. A mobile terminal (MT) 1, in FIG. 1 depicted as a mobile phone, communicates wirelessly via radio signals with a radio base station (BS) 2, e.g. in a cellular communication network. The MT 1 and the BS 2 are non-limiting examples of what is generically referred to below as a "radio-communication apparatus".

Figure 2:
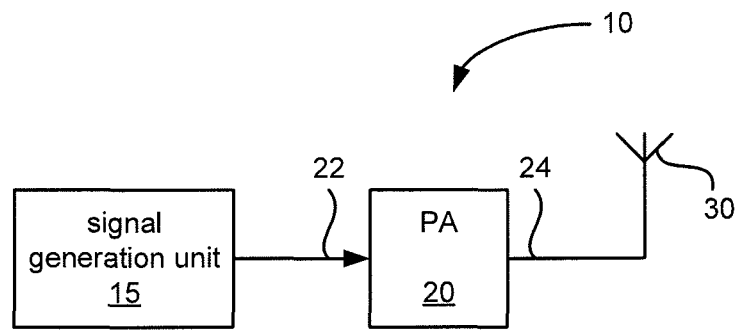
FIG. 2 is a block diagram of a radio-transmitter circuit according to an embodiment of the present invention.

FIG. 2 is a block diagram of a radio-transmitter circuit 10 according to an embodiment of the present invention. The radio-transmitter circuit 10 may be comprised in a radio-communication apparatus, such as the MT 1 or BS 2. According to the embodiment, the radio-transmitter circuit 10 comprises a signal-generation unit 15 and a power amplifier (PA) 20. The signal generation unit 15 is adapted to generate an input signal to the PA 20 and supply the input signal to an input terminal 22 of the PA 20. An output terminal 24 of the PA 20 is operatively connected to an antenna 30, which is fed by the PA 20. The antenna 30 may be a dedicated transmit antenna. Alternatively, the antenna 30 may be a combined transmit and receive antenna which is shared between the radio-transmitter circuit 10 and a radio-receiver circuit of the same radio-communication apparatus.

Figure 3:
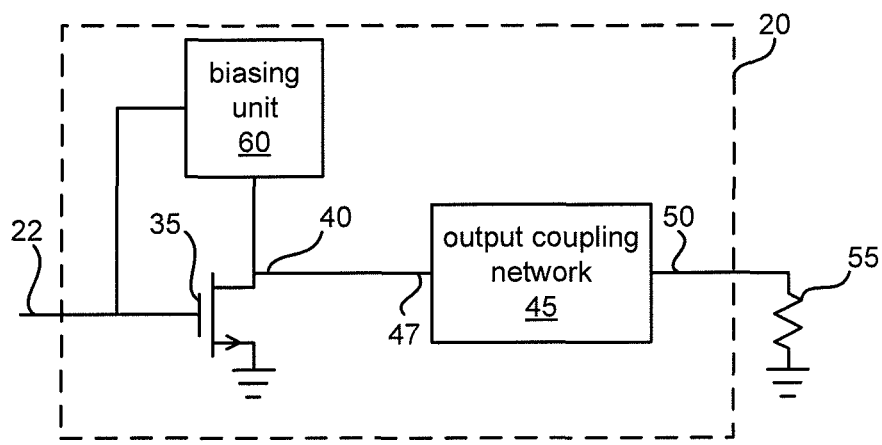
FIG. 3 is a block diagram of a power amplifier according to an embodiment of the present invention.

FIG. 3 is a block diagram of the PA 20 in accordance with an embodiment of the present invention. According to the embodiment, the PA 20 is adapted for operation in at least a first and a second frequency band. A center frequency $f_2$ of the second frequency band is higher than a center frequency $f_1$ of the first frequency band. Furthermore, according to the embodiment, the PA 20 comprises a transistor 35 for amplifying the input signal of the PA 20. In FIG. 3, the transistor is depicted as an NMOS transistor. This is, however, only an example. Other types of transistors may be used in other embodiments. Moreover, according to the embodiment illustrated in FIG. 3, the PA 20 comprises an output coupling network 45 for connecting the power amplifier to a resistive load 55. The output coupling network 45 is operatively connected to an output terminal 40 of the transistor 35. For the particular example depicted in FIG. 3 using an NMOS transistor, the output terminal 40 is the drain terminal of the NMOS transistor. Furthermore, the output coupling network has an output terminal 50 for connection to said resistive load 55. Moreover, the output coupling network is configured such that, when the PA 20 is connected to said resistive load 55, the PA 20 is arranged to operate in class F for frequencies in one of the first and the second frequency bands, and operate in inverse class F (also referred to as class IF) for frequencies in the other one of the first and the second frequency band. Thereby, a single PA 20 capable of operating in multiple frequency bands is obtained. This is advantageous over the solution using multiple single-band PAs discussed in the background section since a reduction of an overall cost, such as circuit area, is facilitated.

Class F and class IF amplifiers belong to the group of so called switch-mode amplifiers, where the transistor is operated as a switch having two states; on (i.e. saturated) and off (i.e. deeply pinched off). An advantage of class F and class IF amplifiers, e.g. compared with class B amplifiers, is that they are capable of providing a higher power-added efficiency (PAE) with essentially the same saturated output power.

In class F and class IF amplifiers, an output coupling network (corresponding to the output coupling network 45 in FIG. 3) is tuned to selectively block one or more harmonics while shorting one or more other harmonics, as is described in more detail below. Class F and class IF amplifiers can be regarded as each other's electrical duals. In a class F amplifier, at least the third harmonic (i.e. at 3f, where f is the fundamental frequency) is blocked. Possibly, one or more additional odd harmonics may be blocked as well. At the same time, at least the second harmonic (i.e. at 2f) is shorted out. Possibly, one or more additional even harmonics may be shorted out as well. Conversely, in a class IF amplifier, at least the third harmonic, and possibly one or more additional odd harmonics, is shorted out. At the same time, at least the second harmonic, and possibly one or more additional even harmonics, is blocked. Generally, the more odd harmonics that are blocked (class F) or shorted out (class IF), and the more even harmonics that are shorted out (class F) or blocked (class IF), the higher the PAE becomes. As the number of the manipulated harmonics increases, the efficiency of an ideal class F or class IF PA increases from the 50% toward unity. However, the non-idealities of the transistor output capacitance and the parasitics make it nearly impossible to make all even and odd harmonics well tuned. Consequently, most practical realizations of microwave class F and class IF amplifiers consider only a few harmonics, mostly the second and third harmonics, which have the most effects on the efficiency and output power enhancement.

As illustrated in FIG. 3, the PA 20 may further comprise a biasing unit 60 arranged to bias the PA 20 at a suitable operating point.

The inventor has realized that relatively low circuit complexity can be obtained when the ratio between the center frequency $f_2$ of the second frequency band and the center frequency $f_1$ of the first frequency band is 1.5. In that case, the second harmonic of $f_2$ coincides with the third harmonic of $f_1$. Thereby, for embodiments where the PA 20 is adapted to operate in class F for frequencies in the first frequency band and in class IF for frequencies in the second frequency band, the same circuitry that is responsible for blocking the third harmonic of $f_1$ (in class F operation) can be used for blocking the second harmonic of $f_2$ (in class IF operation). Similarly, for embodiments where the PA 20 is adapted to operate in class IF for frequencies in the first frequency band and in class F for frequencies in the second frequency band, the same circuitry that is responsible for shorting out the third harmonic of $f_1$ (in class IF operation) can be used for shorting out the second harmonic of $f_2$ (in class F operation). The relation $f_2=1.5f_1$ is assumed in the embodiments described below.

According to some embodiments, the PA 20 is arranged for operation in class F for frequencies in the first frequency band and for operation in class IF for frequencies in the second frequency band. In these embodiments, the output coupling network 45 may be adapted to (when the PA 20 is connected to the resistive load 55), provide an essentially lossless electrical connection between the output terminal 40 of the transistor 35 and the resistive load 55 at the frequencies $f_1$ and $f_2$ (the fundamental frequencies of the respective bands), provide an open circuit between the output terminal 40 of the transistor 35 and the resistive load 55 at the frequency $3f_1=2f_2$ (thereby providing the aforementioned blocking at this frequency), and provide a short circuit between the output terminal 40 of the transistor 35 and a reference-voltage node (e.g. ground) at the frequencies $2f_1$ and $3f_2$ (thereby providing the aforementioned shorting out at these frequencies).

Furthermore, according to some embodiments, the PA 20 is arranged for operation class IF for frequencies in the first frequency band and for operation in class F for frequencies in the second frequency band. In these embodiments, the output coupling network 45 may be adapted to (again when the PA 20 is connected to the resistive load 55) provide an essentially lossless electrical connection between the output terminal 40 of the transistor 35 and the resistive load 55 at the frequencies $f_1$ and $f_2$ (the fundamental frequencies of the respective bands), provide an open circuit between the output terminal 40 of the transistor 35 and the resistive load 55 at the frequencies $2f_1$ and $3f_2$ (thereby providing the aforementioned blocking at these frequencies), and provide a short circuit between the output terminal 40 of the transistor 35 and a reference-voltage node (e.g. ground) at the frequency $3f_1=2f_2$ (thereby providing the aforementioned shorting out at this frequency).

The output coupling network 45 can e.g. be implemented by means of tuned LC resonance circuits or tuned transmission lines, as is outlined in the following.

Figure 4:
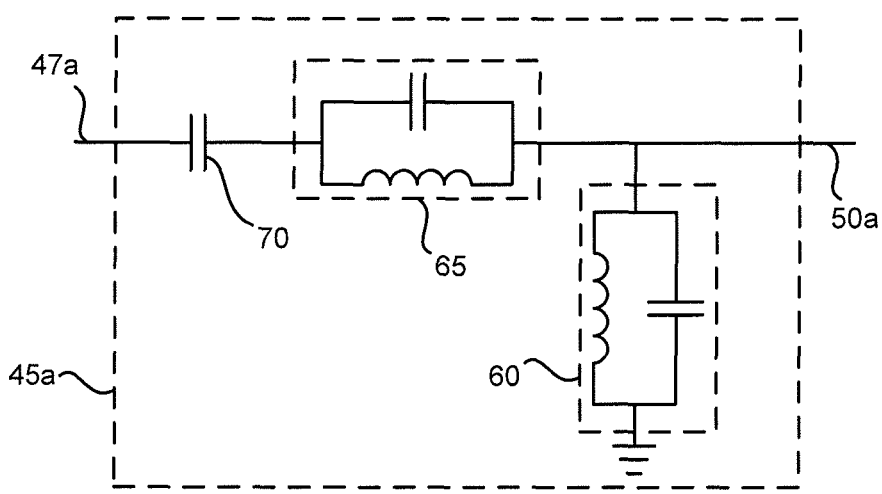

FIG. 4 is a schematic circuit diagram of an output coupling network 45a for use in an ordinary class F or class IF PA according to an example, which is included in this description in order to facilitate the understanding of some embodiments of the output coupling network 45. The letter "a" is used in reference signs 45a, 47a, and 50a to distinguish elements in the example of FIG. 4 from the corresponding elements with reference signs 45, 47, and 50 (see e.g. FIG. 3) of embodiments of the invention. By replacing the output coupling network 45 in FIG. 3 with the output coupling network 45a (with the terminals 47a and 50a connected as the terminals 47 and 50 in FIG. 3), an ordinary class F or class IF PA is obtained. The output coupling network 45a is described below when placed in this context (i.e. having replaced the output coupling network 45 in FIG. 3).

In the output coupling network 45a, a DC-blocking capacitor 70 is provided in order to prevent the DC level of the transistor output from propagating to the resistive load 55. For the RF (radio frequency) frequencies of interest ($f_1$, $f_2$, and there respective harmonics), the DC-blocking capacitor 70 acts as a short circuit.

Furthermore, the output coupling network 45a comprises a parallel-LC resonance circuit 65 operatively connected between the input terminal 47a and the output terminal 50a (i.e. effectively operatively connected between the output terminal 40 of the transistor 35 and the output terminal 50a of the output coupling network 45a). The parallel-LC resonance circuit 65 is adapted to resonate at 3f (class F) or 2f (class IF), where f is the fundamental frequency. Thereby, an open circuit is provided between the output terminal 40 of the transistor 35 and the output terminal 50a of the output coupling network 45a at the frequency 3f of the third harmonic (class F) or the frequency 2f of the second harmonic (class IF), thereby providing the desired blocking at this frequency.

In addition, the output coupling network comprises a parallel-LC resonance circuit 60 operatively connected between the output terminal 50a and a reference voltage node (which is depicted as a ground node in FIG. 4). This parallel-LC resonance circuit 60 is adapted to resonate at the fundamental frequency f. For the fundamental frequency f, the parallel-LC resonance circuit 60 acts as an open circuit between the output terminal 50a and said reference voltage node. Thereby, essentially all the current at the frequency f that is delivered to the input terminal 47a is forwarded to the resistive load 55, thereby providing an essentially lossless connection (as reactive components ideally do not dissipate power) between the output terminal 40 of the transistor 35 and the resistive load 55 at the fundamental frequency f. For the harmonic frequencies, and most notably 2f (class F) or 3f (class IF), the parallel-LC resonance circuit 60 acts as a short circuit between the output terminal 40 of the transistor 35 and the reference voltage node. Thereby, the desired shorting out at the frequency 2f (class F) or 3f (class IF) is obtained. As a consequence, current at these frequencies are prevented from entering the resistive load 55.

Figure 5:
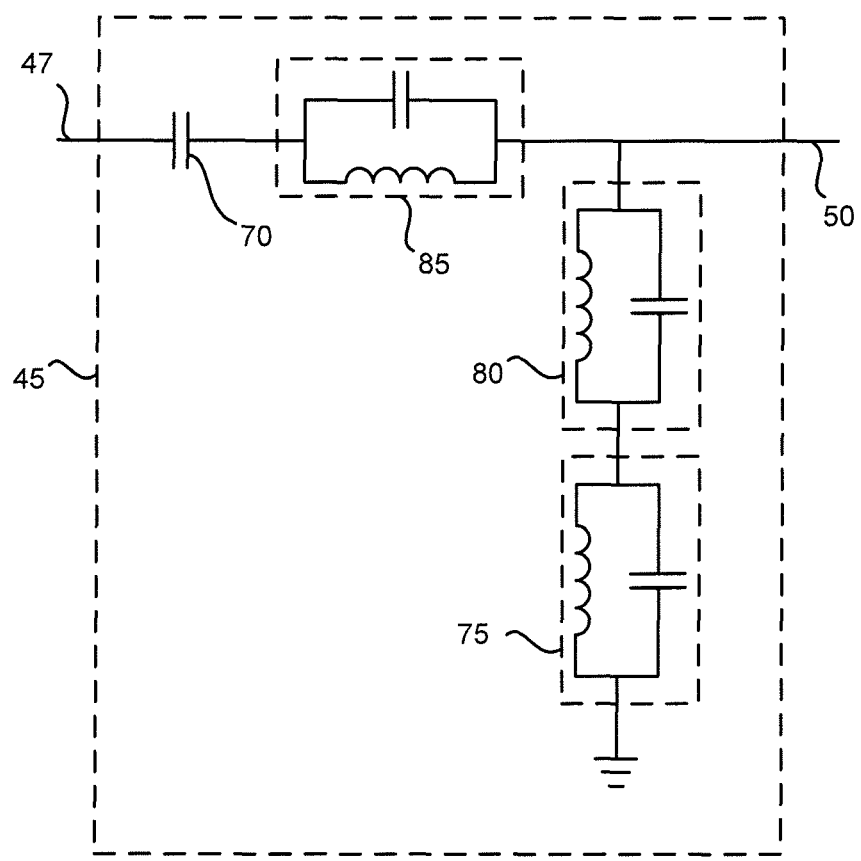

FIG. 5 is a schematic circuit diagram of an embodiment of the output coupling network 45 suitable for use in the PA 20 for embodiments wherein the PA 20 is adapted to operate in class F for frequencies in the first frequency band and in class IF for frequencies in the second frequency band, which is base on the output coupling network 45a illustrated as an example in FIG. 4.

The DC-blocking capacitor 70 has the same purpose as in FIG. 4, and is not further described. According to the embodiment, the output coupling network comprises a parallel-LC resonance circuit 85 operatively connected between the output terminal 40 of the transistor 35 and the output terminal 50 of the output coupling network 45. The parallel-LC resonance circuit 85 is adapted to resonate at the frequency $3f_1=2f_2$ for providing the desired open circuit at $3f_1=2f_2$. Thereby, a blocking is obtained at this frequency, in the same way as described above with reference to the parallel-LC resonance circuit 65 in FIG. 4 above.

Furthermore, according to the embodiment illustrated in FIG. 5, the output coupling network 45 comprises a branch operatively connected between the output terminal 50 of the output coupling network 45 and the reference-voltage node. This branch comprises a parallel-LC resonance circuit 75 and a parallel-LC resonance circuit 80, which is connected in series with the parallel-LC resonance circuit 75. The parallel-LC resonance circuit 75 is adapted to resonate at the frequency $f_1$ and the parallel-LC resonance circuit 80 is adapted to resonate at the frequency $f_2$. Thereby, for the fundamental frequencies $f_1$ and $f_2$, said branch acts as an open circuit between the output terminal 50 and the reference voltage node. Thereby, essentially all the current at the frequencies $f_1$ and $f_2$ that is delivered to the input terminal 47 is forwarded to the resistive load 55, thereby providing the desired essentially lossless connection (again as reactive components ideally do not dissipate power) between the output terminal 40 of the transistor 35 and the resistive load 55 at the fundamental frequencies $f_1$ and $f_2$. For the harmonic frequencies, and most notably $2f_1$ and $3f_2$, said branch acts as a short circuit between the output terminal 40 of the transistor 35 and the reference voltage node. Thereby, the desired shorting out at the frequencies $2f_1$ and $3f_2$ is obtained. As a consequence, current at these frequencies are prevented from entering the resistive load 55.

It can be noted in a comparison between FIGS. 4 and 5 that by only adding one parallel-LC resonance circuit to an output coupling network for an ordinary class F or class IF PA, a PA 20 capable of operating at two frequency bands is obtained. This is a relatively small hardware cost for obtaining this added functionality.

Figure 6:
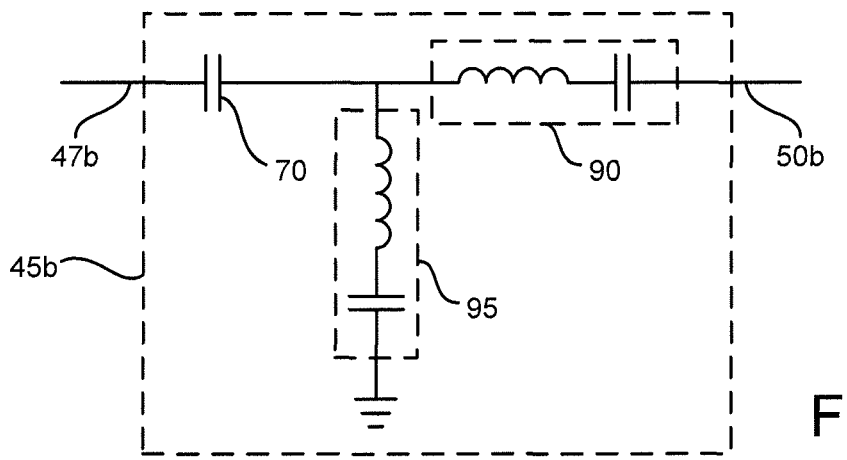

FIG. 6 is a schematic circuit diagram of another output coupling network 45b for use in an ordinary class F or class IF PA according to an example, which is included in this description in order to facilitate the understanding of some embodiments of the output coupling network 45. Similarly to the example illustrated in FIG. 4, the letter "b" is used in reference signs 45b, 47b, and 50b to distinguish elements in the example of FIG. 6 from the corresponding elements with reference signs 45, 47, and 50 of embodiments of the invention. By replacing the output coupling network 45 in FIG. 3 with the output coupling network 45b (with the terminals 47b and 50b connected as the terminals 47 and 50 in FIG. 3), an ordinary class F or class IF PA is obtained. The output coupling network 45b is described below when placed in this context (i.e. having replaced the output coupling network 45 in FIG. 3).

The DC-blocking capacitor 70 has the same purpose as in FIGS. 4 and 5 and is not further described. The output coupling network 45b further comprises a series-LC resonance circuit 95 operatively connected between the output terminal 40 of the transistor 35 and the reference voltage node. The series-LC resonance circuit 95 is adapted to resonate at the frequency 2f (class F) or 3f (class IF). For this frequency, the series-LC resonance circuit acts as a short circuit, thereby providing the desired shorting out at this frequency. For the fundamental frequency f and the other harmonics, the series-LC resonance circuit 95 acts as an open circuit. Furthermore, the output coupling network 45b comprises a series-LC resonance circuit 90 operatively connected between the output terminal 40 of the transistor 35 and the output terminal 50b of the output coupling network 45b. The series-LC resonance circuit 90 is adapted to resonate at the fundamental frequency f, thereby acting as a short circuit at the frequency f. Hence, an essentially loss less electrical connection between the output terminal 40 of the transistor 35 and the resistive load 55 is provided (again since reactive components ideally do no dissipate any power). For the harmonic frequencies, and most notably the frequency 3f (class F) or 2f (class IF), the series-LC resonance circuit 90 acts as an open circuit, thereby providing the desired blocking at these frequencies.

Figure 7:
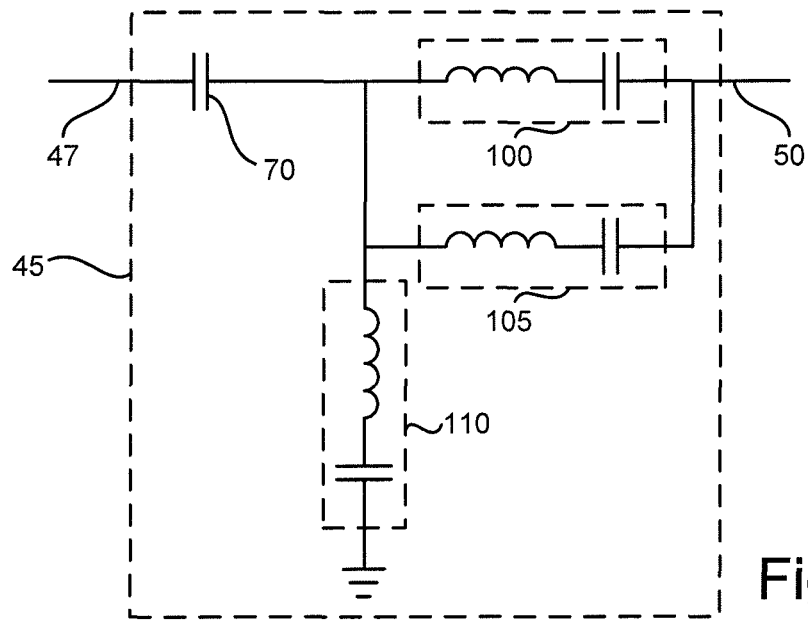

FIG. 7 is a schematic circuit diagram of an embodiment of the output coupling network 45 suitable for use in the PA 20 for embodiments wherein the PA 20 is adapted to operate in class IF for frequencies in the first frequency band and in class F for frequencies in the second frequency band, which is base on the output coupling network 45b illustrated as an example in FIG. 6.

The DC-blocking capacitor 70 has the same purpose as in FIGS. 4-6, and is not further described. According to the embodiment, the output coupling network 45 comprises series-LC resonance circuit 110 operatively connected between the output terminal 40 of the transistor 35 and the reference voltage node. The series-LC resonance circuit 110 is adapted to resonate at the frequency $3f_1=2f_2$ for providing said short circuit at the frequency $3f_1=2f_2$. Thereby, a shorting out at this frequency is obtained in the same way as for the series-LC resonance circuit 95 (FIG. 6). Furthermore, according to this embodiment, the output coupling network 45 comprises a branch operatively connected between the output terminal 40 of the transistor 35 and the output terminal 50 of the output coupling network 45. Said branch comprises a series-LC resonance circuit 100 and a series-LC resonance circuit 105, which is connected in parallel with the series-LC resonance circuit 100. The series-LC resonance circuit 100 is adapted to resonate at the frequency $f_1$ and the series-LC resonance circuit 105 is adapted to resonate at the frequency $f_2$. For the frequencies $f_1$ and $f_2$, said branch therefore acts as a short circuit, thereby providing the desired essentially lossless electrical connection between the output terminal 40 of the transistor 35 and the resistive load 55 at the frequencies $f_1$ and $f_2$. At the harmonic frequencies, and most notably the frequencies $2f_1$ and $3f_2$, said branch acts as an open circuit. Thereby, the desired open circuit between the output terminal 40 of the transistor 35 and the resistive load 55 at the frequencies $2f_1$ and $3f_2$ is obtained.

In some embodiments, tuned transmission lines are used to provide the desired functionality of the output coupling network. Hence, in some embodiments where the PA 20 is arranged for operation in class F for frequencies in the first frequency band and for operation in class IF for frequencies in the second frequency band, the output coupling network 45 may comprise transmission lines adapted to provide the desired essentially lossless electrical connection at the frequencies $f_1$ and $f_2$, the desired open circuit at the frequency $3f_1=2f_2$, and said short circuit at the frequencies $2f_1$ and $3f_2$. Similarly, in some embodiments where the PA 20 is arranged for operation in class IF for frequencies in the first frequency band and for operation in class F for frequencies in the second frequency band, the output coupling network 45 may comprise transmission lines adapted to provide the desired essentially lossless electrical connection at the frequencies $f_1$ and $f_2$, the desired open circuit at the frequencies $2f_1$ and $3f_2$, and the desired short circuit at the frequency $3f_1=2f_2$.

Figure 8:
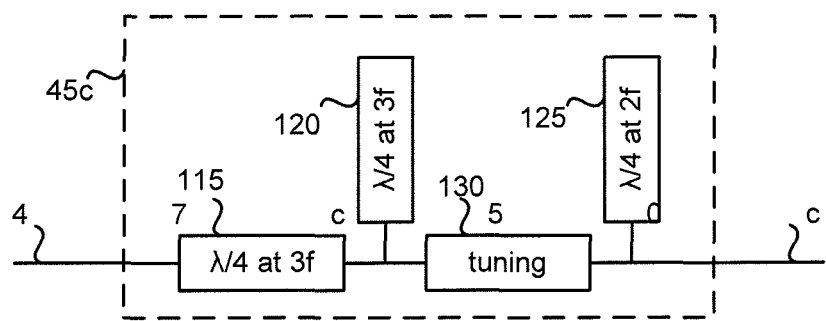

FIGS. 8 and 9 are schematic circuit diagrams of output coupling networks 45c and 45d, respectively, for use in ordinary class F and class IF PAs, respectively, according to examples, which are included in this description in order to facilitate the understanding of some embodiments of the output coupling network 45. Similarly to the example illustrated in FIGS. 4 and 6, the letters "c" and "d" are used in reference signs 45c-d, 47c-d, and 50c-d to distinguish elements in the examples of FIGS. 8-9 from the corresponding elements with reference signs 45, 47, and 50 of embodiments of the invention. By replacing the output coupling network 45 in FIG. 3 with the output coupling network 45c (with the terminals 47c and 50c connected as the terminals 47 and 50 in FIG. 3) or 45d (with the terminals 47d and 50d connected as the terminals 47 and 50 in FIG. 3), an ordinary class F (FIG. 8) or class IF (FIG. 9) PA is obtained. The output coupling networks 45c and 45d are described below when placed in this context (i.e. having replaced the output coupling network 45 in FIG. 3).

The output coupling network 45c in FIG. 8 comprises transmission lines 115 and 120, both having a length of $\lambda/4$ at the frequency 3f (where $\lambda$ denotes the corresponding wavelength). The transmission lines 115 and 120 are responsible for providing an open circuit at the frequency 3f, thereby providing the desired blocking of the third harmonic. Furthermore, the output coupling network 45c comprises a transmission line 125 having a length of $\lambda/4$ at the frequency 2f. The transmission line 125 is responsible for providing a short circuit at the frequency 2f, thereby providing the desired shorting out of the second harmonic. In addition, the output coupling network comprises a tuning line 130, the length of which is tuned such that a proper impedance matching is obtained at the fundamental frequency f. The term "tuning line" is used herein to denote a transmission line, the length of which is selected, or tuned, during design in order to obtain a desired functionality. It should be noted that the transmission-line embodiments presented herein are only examples, and that other realizations yielding the same functionality are also possible within the scope of the invention. For example, in some embodiments, also transmission lines indicated in the figures to have a specific length (e.g $\lambda/4$ or $\lambda/2$) may be tuned during the design of the circuit. In these cases, the indicated lengths may be seen as suitable start values.

The output coupling network 45d in FIG. 9 comprises transmission lines 135 and 140, both having a length of $\lambda/4$ at the frequency 2f. The transmission lines 135 and 140 are responsible for providing an open circuit at the frequency 2f, thereby providing the desired blocking of the second harmonic. Furthermore, the output coupling network 45d comprises a transmission line 145 having a length of $\lambda/4$ at the frequency 3f. The transmission line 145 is responsible for providing a short circuit at the frequency 3f, thereby providing the desired shorting out of the third harmonic. In addition, the output coupling network comprises a tuning line 150, the length of which is tuned such that a proper impedance matching is obtained at the fundamental frequency f.

FIG. 10 is a schematic circuit diagram of the output coupling network 45 according to an embodiment of the present invention, which is partly based on the same principles as the examples related to ordinary class F and class IF PAs illustrated in FIGS. 8 and 9. This embodiment relates to the case where the PA 20 is adapted to operate in class F for frequencies in the first frequency band, and in class IF for frequencies in the second frequency band. According to the embodiment, the output coupling network 45 comprises transmission lines 155 and 160, both having a length of $\lambda/4$ at the frequency $3f_1=2f_2$. The transmission lines 155 and 160 are responsible for providing the desired open circuit at this frequency. Furthermore, the output coupling network 45 according to this embodiment comprises a transmission line 165 having a length of $\lambda/4$ at the frequency $2f_1$, a transmission line 170, grounded at one and having a length of $\lambda/2$ at the frequency $3f_2$, and a tuning line 175. The length of the tuning line 175 is selected such that the tuning line 175, together with the transmission lines 165 and 170, provides the desired short circuit at the frequencies $2f_1$ and $3f_2$. In addition, the output coupling network 45 according to this embodiment comprises tuning lines 180 and 185, the length of which are selected such that a proper impedance matching is obtained at the fundamental frequencies $f_1$ and $f_2$.

FIG. 11 is a schematic circuit diagram of the output coupling network 45 according to another embodiment of the present invention, which is partly based on the same principles as the examples related to ordinary class F and class IF PAs illustrated in FIGS. 8 and 9. This embodiment relates to the case where the PA 20 is adapted to operate in class IF for frequencies in the first frequency band, and in class F for frequencies in the second frequency band. According to the embodiment, the output coupling network 45 comprises a transmission lines 190 having a length of $\lambda/4$ at the frequency $3f_2$ and a transmission line 195, grounded at one end and having a length of $\lambda/2$ at the frequency $3f_2$. The transmission lines 190 and 195 are responsible for providing the desired open circuit at the frequency $3f_2$. Furthermore, the output coupling network 45 according to this embodiment comprises a transmission line 200 having a length of $\lambda/4$ at the frequency $2f_1$ and a tuning line 210. The length of the tuning line 210 is selected such that the tuning line 210, together with the transmission line 200, provides the desired open circuit at the frequency $2f_1$. Moreover, the output coupling network 45 according to this embodiment comprises a transmission line 205 having a length of $\lambda/4$ at the frequency $3f_1=2f_2$ and a tuning line 215. The length of the tuning line 215 is selected such that the tuning line 215, together with the transmission line 205, provides the desired short circuit at the frequency $3f_1=2f_2$. In addition, the output coupling network 45 according to this embodiment comprises tuning lines 220 and 225, the length of which are selected such that a proper impedance matching is obtained at the fundamental frequencies $f_1$ and $f_2$.

According to some embodiments of the present invention, the PA 20 is adapted for operation in more than two frequency bands. In these embodiments, the PA 20 may be adapted for operation alternatingly in class F and in class IF in every other frequency band.

For example, according to some embodiments, the PA 20 may be further arranged for operation in an additional third frequency band (i.e. in addition to the above-mentioned first and second frequency bands), wherein a center frequency $f_3$ of the third frequency band is higher than the center frequency $f_2$ of the second frequency band (and consequently higher also than the center frequency $f_1$ of the first frequency band). In these embodiments, the output coupling network 45 may be configured such that, when the power amplifier is connected to said resistive load 55, the PA 20 is arranged to operate in the same class for frequencies in the third frequency band as for frequencies in the first frequency band. That is, the PA 20 may be arranged to operate in class F in the first and third frequency bands, and in class IF in the second frequency band. Alternatively, the PA 20 may be arranged to operate in class IF in the first and third frequency bands, and in class F in the second frequency band.

In addition, according to some embodiments, the PA 20 may be further arranged for operation in an additional fourth frequency band (i.e. in addition to the above-mentioned first, second, and third frequency bands), wherein a center frequency $f_4$ of the fourth frequency band is higher than the center frequency $f_3$ of the third frequency band (and consequently higher also than the center frequencies $f_1$ and $f_2$ of the first and second frequency bands). In these embodiments, the output coupling network 45 may be configured such that, when the power amplifier is connected to said resistive load 55, the PA 20 is arranged to operate in the same class for frequencies in the fourth frequency band as for frequencies in the second frequency band. That is, the PA 20 may be arranged to operate in class F in the first and third frequency bands, and in class IF in the second and fourth frequency bands. Alternatively, the PA 20 may be arranged to operate in class IF in the first and third frequency bands, and in class F in the second and fourth frequency bands.

The embodiments described below only concern the cases with three and four frequency bands. However, the invention is not limited thereto, and the above-described principle with operation in class F and class IF in every other frequency band can be extended in a natural way to more than four frequency bands.

In similarity with the above described relationship between the center frequencies $f_1$ and $f_2$ of the first and second frequency bands, the inventor has realized that relatively low circuit complexity can be obtained when the ratio between the center frequency $f_4$ of the fourth frequency band and the center frequency $f_3$ of the third frequency band is 1.5. In that case, the second harmonic of $f_4$ coincides with the third harmonic of $f_3$. Thereby, for embodiments where the PA 20 is adapted to operate in class F for frequencies in the third frequency band and in class IF for frequencies in the fourth frequency band, the same circuitry that is responsible for blocking the third harmonic of $f_3$ (in class F operation) can be used for blocking the second harmonic of $f_4$ (in class IF operation). Similarly, for embodiments where the PA 20 is adapted to operate in class IF for frequencies in the third frequency band and in class F for frequencies in the fourth frequency band, the same circuitry that is responsible for shorting out the third harmonic of $f_3$ (in class IF operation) can be used for shorting out the second harmonic of $f_4$ (in class F operation). The relation $f_4=1.5f_3$ is assumed in the embodiments described below.

As mentioned above, according to some embodiments, the PA 20 is arranged for operation in class F for frequencies in the first (and third) frequency band and for operation in class IF for frequencies in the second (and fourth) frequency band. In these embodiments, wherein the output coupling network 45 may be adapted to (when the PA 20 is connected to the resistive load 55), provide an essentially lossless electrical connection between the output terminal 40 of the transistor 35 and the resistive load 55 at the frequencies $f_3$ and $f_4$ (the fundamental frequencies of the respective bands), provide an open circuit between the output terminal 40 of the transistor 35 and the resistive load 55 at the frequency $3f_3=2f_4$ (to obtain the desired blocking at this frequency), and provide a short circuit between the output terminal 40 of the transistor 35 and a reference-voltage node (e.g. ground) at the frequencies $2f_3$ and $3f_4$ (to obtain the desired shorting out at these frequencies).

As is also mentioned above, according to some embodiments, the PA 20 may be arranged for operation in class IF for frequencies in the first (and third) frequency band and for operation in class F for frequencies in the second (and fourth) frequency band. In these embodiments, the output coupling network 45 may be adapted to (when the PA 20 is connected to said resistive load 55), provide an essentially lossless electrical connection between the output terminal 40 of the transistor 35 and the resistive load 55 at the frequencies $f_3$ and $f_4$ (the fundamental frequencies of the respective bands), provide an open circuit between the output terminal 40 of the transistor 35 and the resistive load 55 at the frequencies $2f_3$ and $3f_4$ (to obtain the desired blocking at these frequencies), and provide a short circuit between the output terminal 40 of the transistor 35 and a reference-voltage node (e.g. ground) at the frequency $3f_3=2f_4$ (to obtain the desired shorting out at this frequency).

Figure 12:
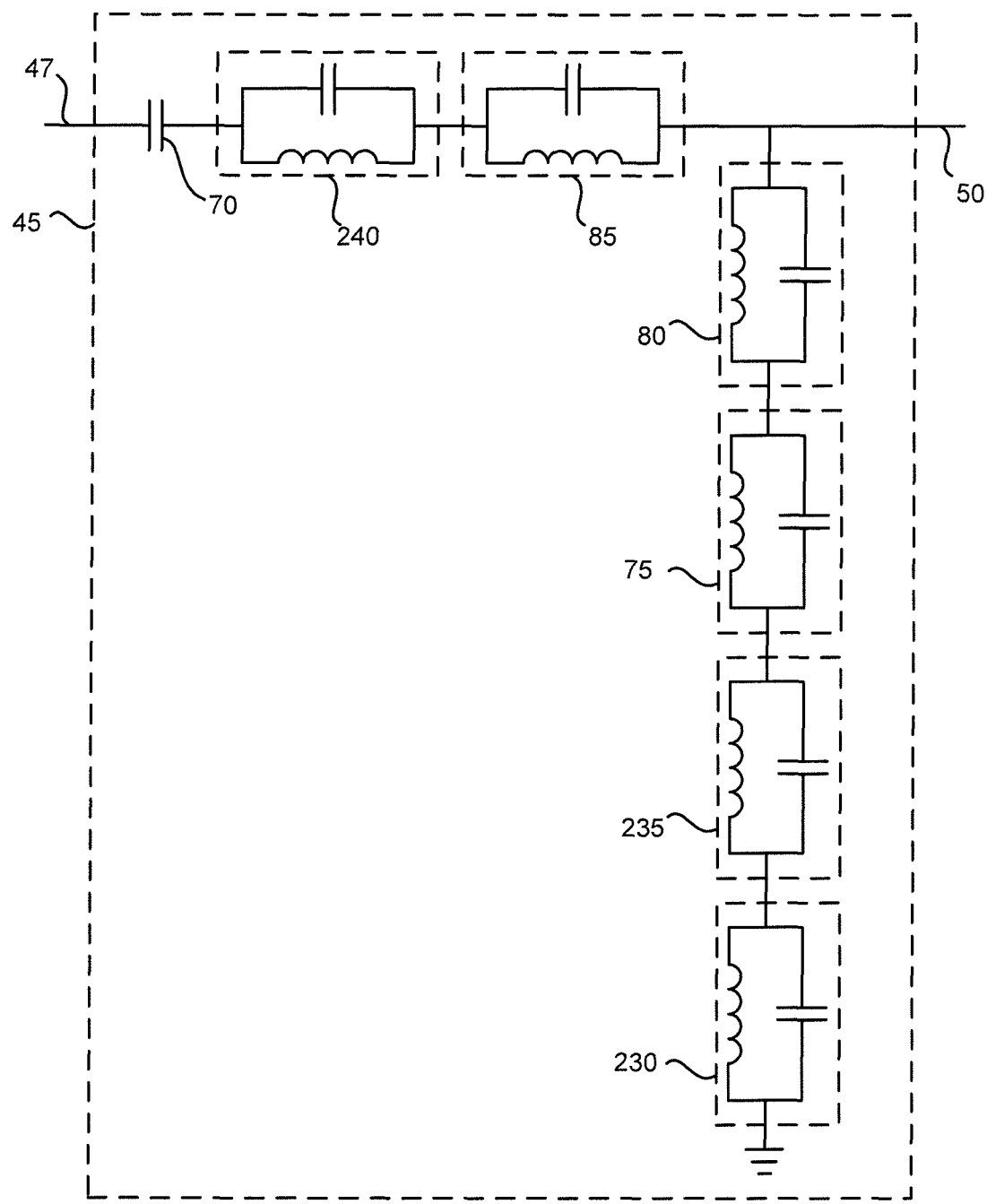

FIG. 12 is a schematic circuit diagram of an embodiment of the output coupling network 45 suitable for use in the PA 20 for embodiments wherein the PA 20 is adapted to operate in four frequency bands; in class F for frequencies in the first and third frequency band and in class IF for frequencies in the second and fourth frequency band. This embodiment can be seen as an extension of the embodiment of the output coupling network illustrated in FIG. 5. The DC-blocking capacitor 70 and the parallel-LC resonance circuits 75, 80, and 85 have the same purpose as in the embodiment of the output coupling network 45 illustrated in FIG. 5, and are not further described in the context of FIG. 12. In addition, the embodiment illustrated in FIG. 12 comprises a parallel-LC resonance circuit 240 operatively connected (in series with the parallel-LC resonance circuit 85) between the output terminal 40 of the transistor 35 and the output terminal 50 of the output coupling network 45. The parallel-LC resonance circuit 240 is adapted to resonate at the frequency $3f_3=2f_4$ for providing the desired open circuit at $3f_1=2f_2$. Thereby, the desired blocking is obtained at this frequency. Furthermore, the embodiment of the output coupling network 45 illustrated in FIG. 12 comprises parallel-LC resonance circuits 230 and 235 connected in series with the parallel-LC resonance circuits 75 and 80 in the branch, which is operatively connected between the output terminal 50 of the output coupling network 45 and the reference-voltage node. The parallel-LC resonance circuit 230 is adapted to resonate at the frequency $f_3$ and the parallel-LC resonance circuit 235 is adapted to resonate at the frequency $f_4$. Thereby, for the fundamental frequencies $f_3$ and $f_4$, said branch acts as an open circuit between the output terminal 50 and the reference voltage node. Thereby, essentially all the current at the frequencies $f_3$ and $f_4$ that is delivered to the input terminal 47 is forwarded to the resistive load 55, thereby providing the desired essentially lossless connection (again as reactive components ideally do not dissipate power) between the output terminal 40 of the transistor 35 and the resistive load 55 at the fundamental frequencies $f_3$ and $f_4$. For the harmonic frequencies, and most notably $2f_1$, $3f_2$, $2f_3$, and $3f_4$, said branch acts as a short circuit between the output terminal 40 of the transistor 35 and the reference voltage node. Thereby, the desired shorting out at the frequencies $2f_1$, $3f_2$, $2f_3$, and $3f_4$ is obtained. As a consequence, current at these frequencies are prevented from entering the resistive load 55.

Figure 13:
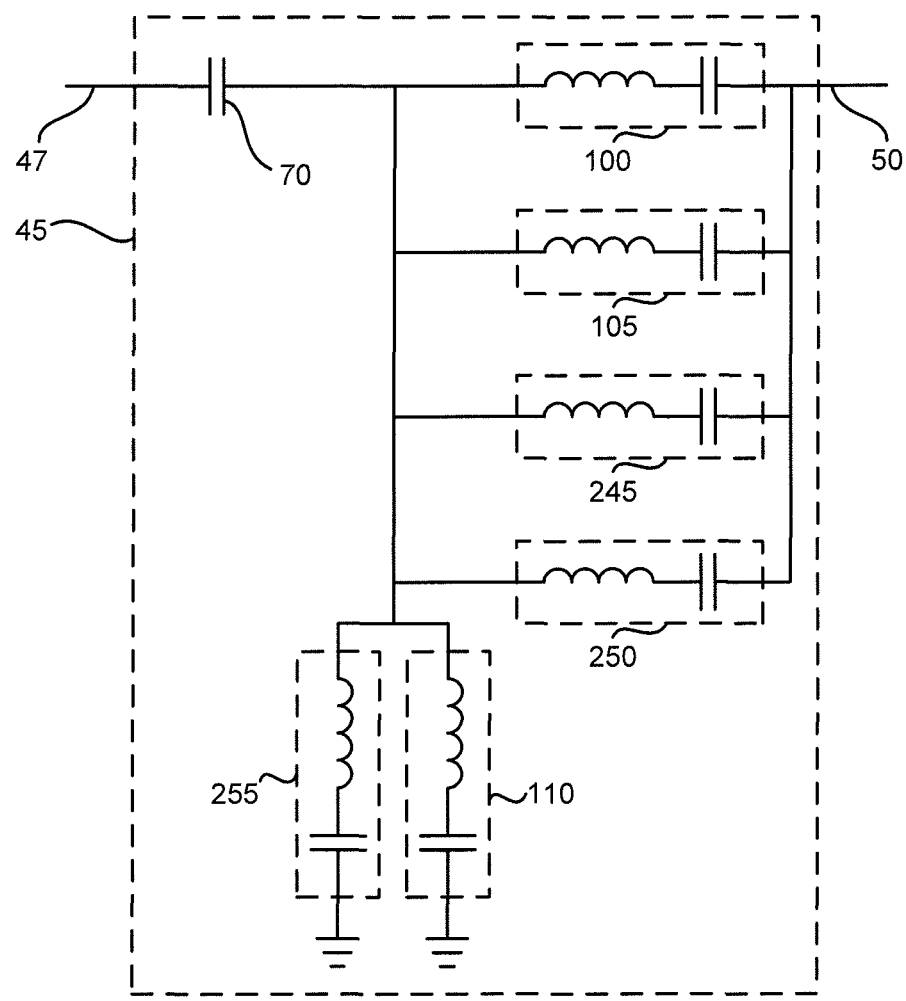

FIG. 13 is a schematic circuit diagram of an embodiment of the output coupling network 45 suitable for use in the PA 20 for embodiments wherein the PA 20 is adapted to operate in four frequency bands; in class IF for frequencies in the first and third frequency band and in class F for frequencies in the second and fourth frequency band. This embodiment can be seen as an extension of the embodiment of the output coupling network illustrated in FIG. 7. The DC-blocking capacitor 70 and the series-LC resonance circuits 100, 105, and 110 have the same purpose as in the embodiment of the output coupling network 45 illustrated in FIG. 7, and are not further described in the context of FIG. 13. In addition, the embodiment of the output coupling network 45 illustrated in FIG. 13 comprises a series-LC resonance circuit 255 operatively connected (in parallel with the series-LC resonance circuit 110) between the output terminal 40 of the transistor 35 and the reference voltage node. The series-LC resonance circuit 255 is adapted to resonate at the frequency $3f_3=2f_4$ for providing said short circuit at the frequency $3f_3=2f_4$. Thereby, the desired shorting out at this frequency is obtained. Furthermore, the embodiment of the output coupling network 45 illustrated in FIG. 13 comprises series-LC resonance circuit 245 and 250 connected in parallel with the series-LC resonance circuits 100 and 105 in said branch, which is operatively connected between the output terminal 40 of the transistor 35 and the output terminal 50 of the output coupling network 45. The series-LC resonance circuit 245 is adapted to resonate at the frequency $f_3$ and the series-LC resonance circuit 250 is adapted to resonate at the frequency $f_4$. For the frequencies $f_3$ and $f_4$, said branch therefore acts as a short circuit, thereby providing the desired essentially lossless electrical connection between the output terminal 40 of the transistor 35 and the resistive load 55 at the frequencies $f_3$ and $f_4$. At the harmonic frequencies, and most notably the frequencies $2f_1$, $3f_2$, $2f_3$ and $3f_4$, said branch acts as an open circuit. Thereby, the desired open circuit between the output terminal 40 of the transistor 35 and the resistive load 55 at the frequencies $2f_1$, $3f_2$, $2f_3$ and $3f_4$ is obtained.

Also for embodiments wherein the PA 20 is arranged for operation in more than two frequency bands, tuned transmission lines may be used to provide the desired functionality of the output coupling network 45. The inventor has realized that, for such transmission line realizations, a relatively low circuit complexity can be obtained if the ratio between the center frequency $f_3$ of the third frequency band and the center frequency $f_2$ of the second frequency band is 1.5. More generally speaking, for an arbitrary number of frequency bands, said relatively low circuit complexity can be obtained if the ratio between the center frequency $f_n$ of an n:th frequency band and the center frequency $f_{n-1}$ of the closest lower (or (n−1):th) frequency band is 1.5 for all n≥2. In the embodiments described below, the ratio $f_3/f_2$ is assumed to be 1.5.

Figure 14:
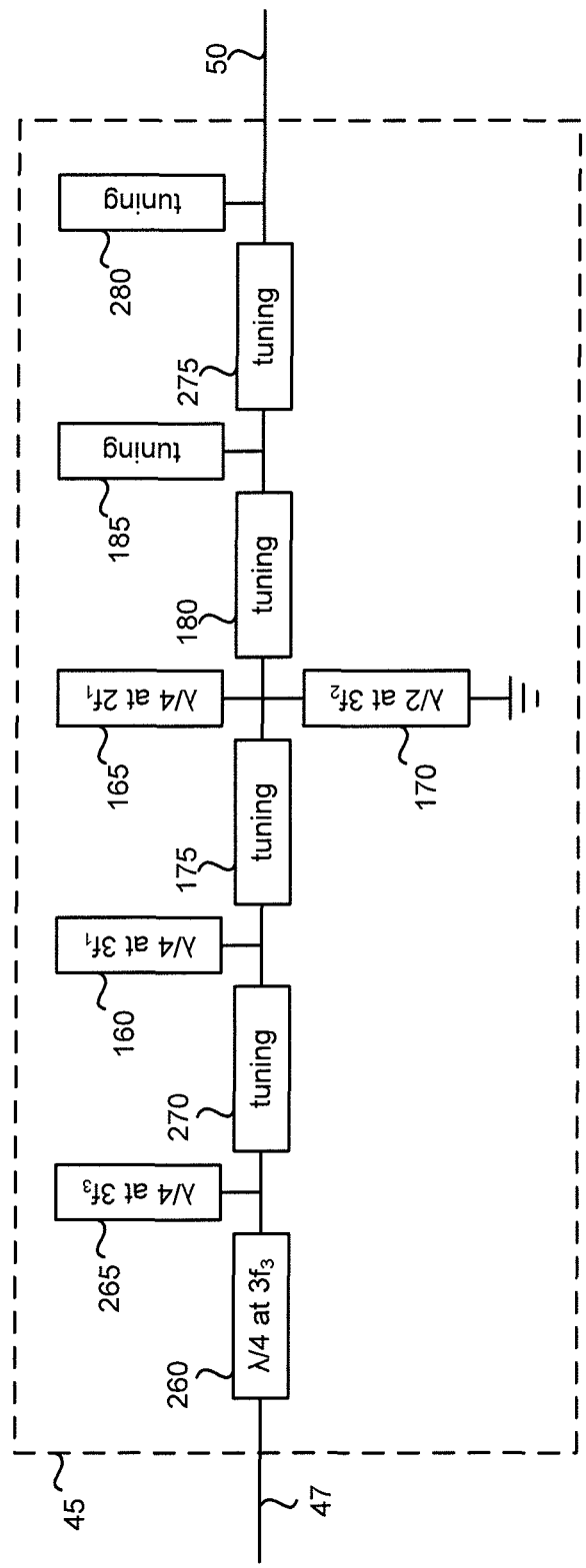

FIG. 14 is a schematic circuit diagram of an embodiment of the output coupling network 45. This embodiment of the output coupling network 45 is suitable for use in embodiments where the PA 20 is adapted for operation in three frequency bands; in class F in the first and third frequency band and in class IF in the second frequency band. The embodiment can be seen as an extension of the embodiment illustrated in FIG. 10. The transmission lines 160, 165, 170, 175, 180, and 185 have the same purpose as in the embodiment illustrated in FIG. 10, and are not described in any greater detail in the context of FIG. 14. However, it can be noted that since $f_3$ is selected as $1.5f_2$, $2f_3=3f_2$. Therefore, the shorting out provided at $3f_2$ also yields a shorting out at $2f_3$ (since this is the same frequency). For other relationships between $f_3$ and $f_2$, additional transmission lines may need to be included in order to provide a shorting out at $2f_3$.

In addition, the embodiment of the output coupling network 45 illustrated in FIG. 14 comprises transmission lines 260 and 265, both having a length of $\lambda/4$ at the frequency $3f_3$. The transmission lines 260 and 265 are responsible for providing the desired open circuit at this frequency. Furthermore, the output coupling network 45 according to this embodiment comprises a tuning line 270 (which in some sense can be seen as replacing the transmission line 155 in FIG. 10), the length of which is selected such that the tuning line 270 together with the transmission line 160 provides the desired open circuit at the frequency at the frequency $3f_1$.

Moreover, the embodiment of the output coupling network 45 illustrated in FIG. 14 comprises tuning lines 275 and 280. The tuning lines 275 and 280, together with the tuning lines 180 and 185, are responsible for providing a proper impedance matching at the fundamental frequencies $f_1$, $f_2$, and $f_3$, and the lengths of these tuning lines are selected accordingly. In some case, such impedance matching may be possible to obtain without the additional tuning lines 275 and 280. Whether or not this is the case can e.g. be determined by trial and error based on computer simulations using an accurate model of the transistor 35.

Figure 15:
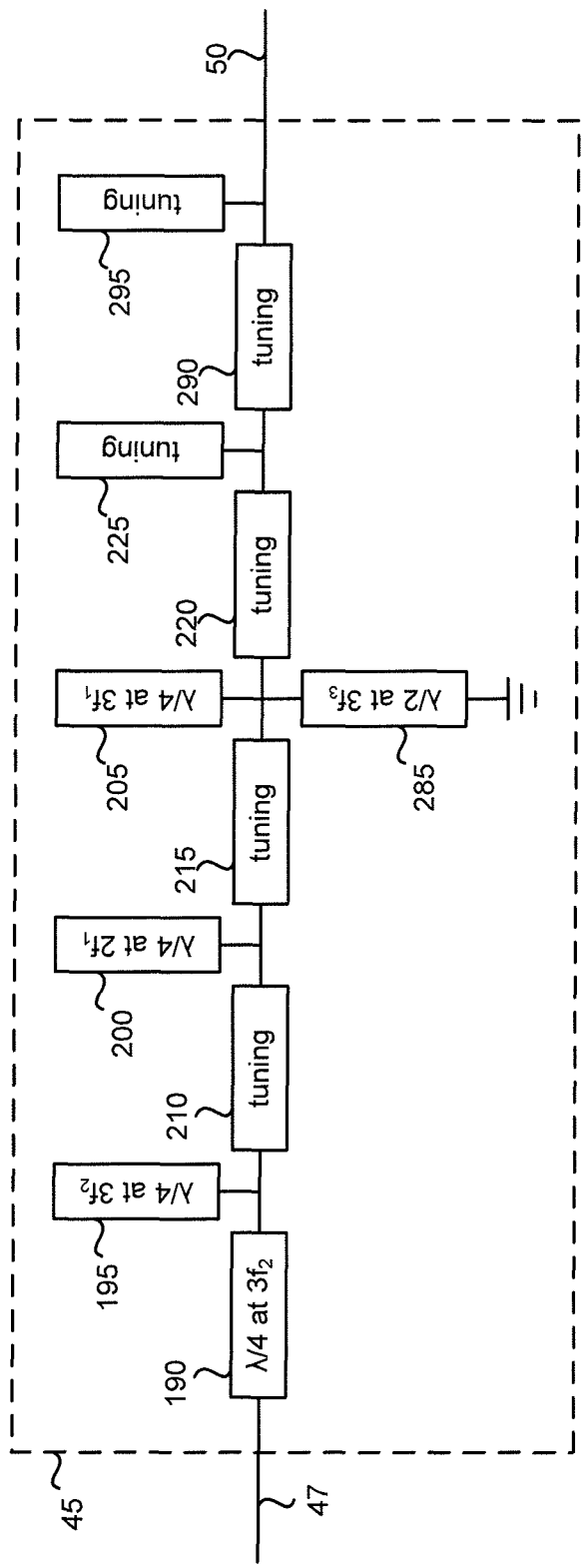

FIG. 15 is a schematic circuit diagram of another embodiment of the output coupling network 45. This embodiment of the output coupling network 45 is suitable for use in embodiments where the PA 20 is adapted for operation in three frequency bands; in class IF in the first and third frequency band and in class F in the second frequency band. The embodiment can be seen as an extension of the embodiment illustrated in FIG. 11. The transmission lines 190, 195, 200, 205, 210, 215, 220, and 225 have the same purpose as in the embodiment illustrated in FIG. 11, and are not described in any greater detail in the context of FIG. 15. However, it can be noted that since $f_3$ is selected as $1.5f_2$, $2f_3=3f_2$. Therefore, the blocking provided at $3f_2$ also yields a blocking at $2f_3$ (since this is the same frequency). For other relationships between $f_3$ and $f_2$, additional transmission lines may need to be included in order to provide a blocking at $2f_3$.

In addition, the embodiment of the output coupling network illustrated in FIG. 15 comprises a transmission line 285, grounded at one end and having a length of $\lambda/2$ at the frequency $3f_3$. The transmission line 285 is responsible for providing the desired shorting out at this frequency.

Moreover, the embodiment of the output coupling network 45 illustrated in FIG. 15 comprises tuning lines 290 and 295. The tuning lines 290 and 295, together with the tuning lines 220 and 225, are responsible for providing a proper impedance matching at the fundamental frequencies $f_1$, $f_2$, and $f_3$, and the lengths of these tuning lines are selected accordingly. Similarly to the embodiment of FIG. 14, such impedance matching may, in some cases, be possible to obtain without the additional tuning lines 290 and 295. Whether or not this is the case can, as for the embodiment of FIG. 14, e.g. be determined by trial and error based on computer simulations using accurate models of the resistive load 55 and the transistor 35.

Figure 16:
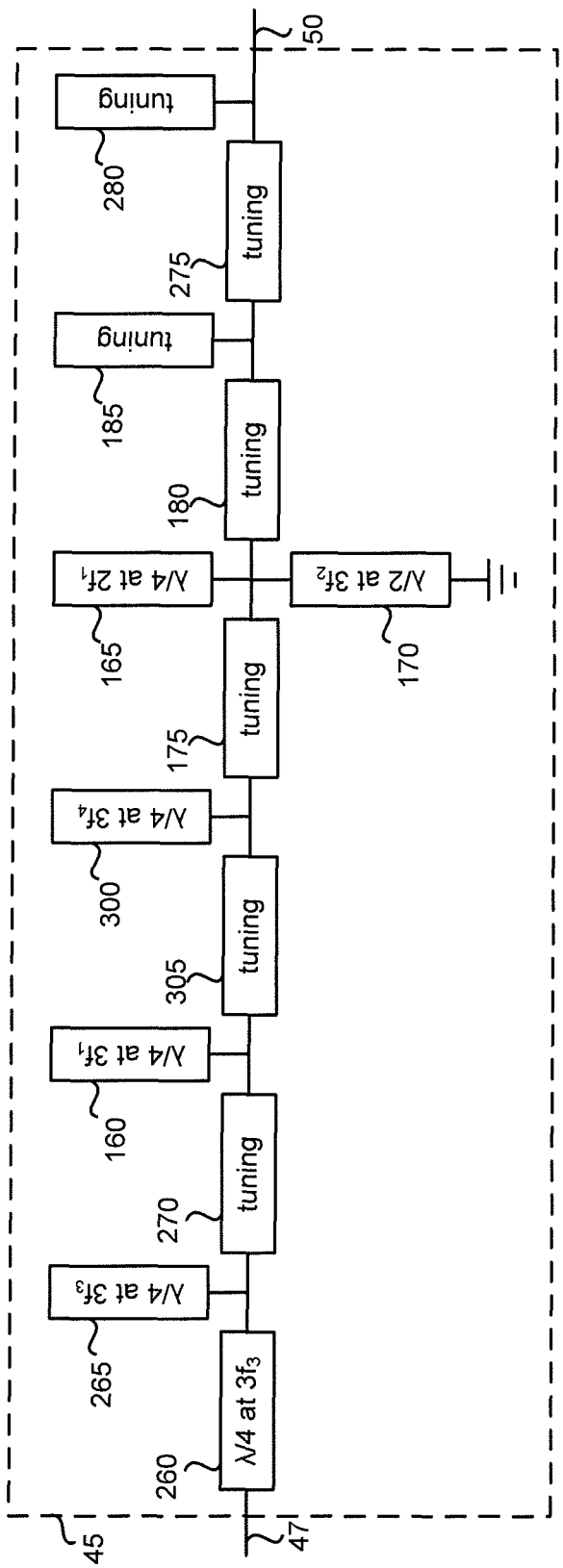

FIG. 16 is a schematic circuit diagram of yet another embodiment of the output coupling network 45. This embodiment of the output coupling network 45 is suitable for use in embodiments where the PA 20 is adapted for operation in four frequency bands; in class F in the first and third frequency band and in class IF in the second and fourth frequency band. The embodiment can be seen as an extension of the embodiment illustrated in FIG. 14. The transmission lines 160, 165, 170, 175, 180, 185, 260, 265, 270, 275, and 280 have the same purpose as in the embodiment illustrated in FIG. 14, and are not described in any greater detail in the context of FIG. 16. However, it can be noted that since $f_4$ is selected as 1.5 $f_3$, $2f_4=3f_3$. Therefore, the blocking provided at $3f_3$ also yields a blocking at $2f_4$ (since this is the same frequency).

In addition, the embodiment of the output coupling network 45 illustrated in FIG. 16 comprises a transmission line 300 having a length of $\lambda/4$ at the frequency $3f_4$. Furthermore, this embodiment of the output coupling network 45 comprises a tuning line 305. The length of the tuning line 305 is selected such that the tuning line 305 in combination with the transmission line 300 provides the desired shorting out at the frequency $3f_4$.

Similarly to the embodiment of FIG. 14, the tuning lines 275 and 280, together with the tuning lines 180 and 185, are responsible for providing a proper impedance matching at the fundamental frequencies $f_1$, $f_2$, $f_3$, and $f_4$, and the lengths of these tuning lines are selected accordingly. Again, in some case, such impedance matching may be possible to obtain without the additional tuning lines 275 and 280. Whether or not this is the case can e.g. be determined by trial and error based on computer simulations using accurate models of the resistive load 55 and the transistor 35.

Figure 17:
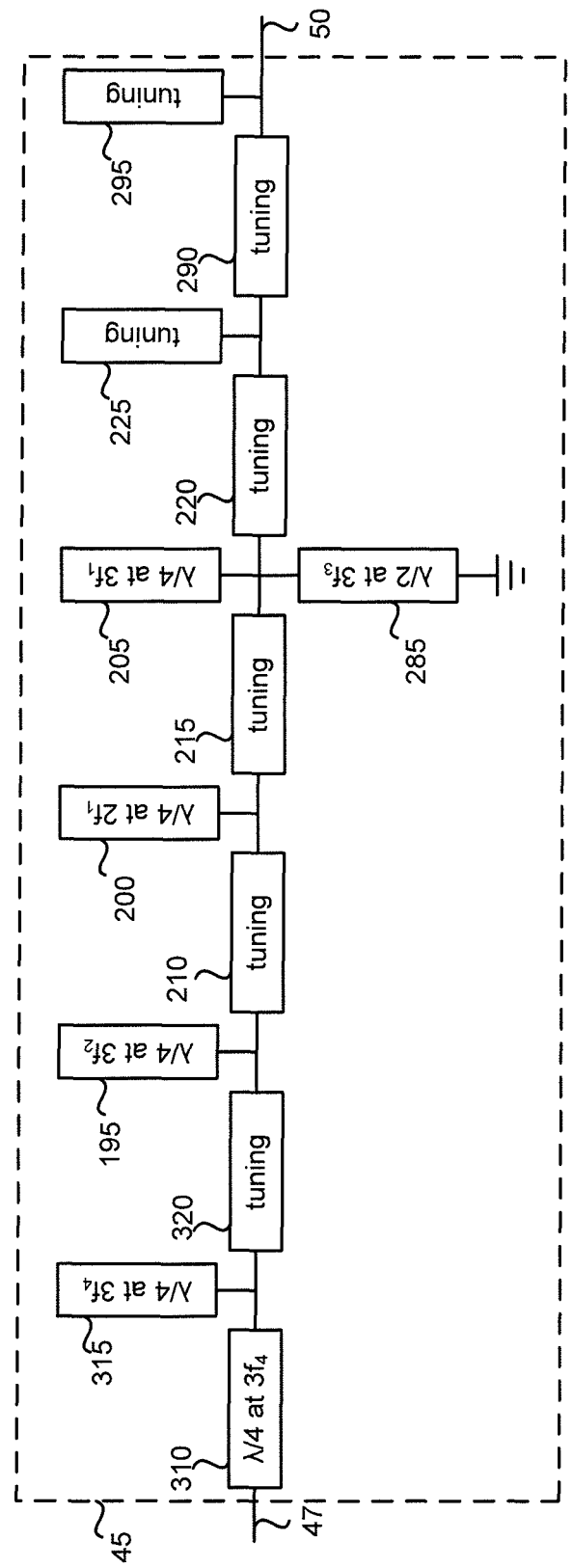

FIG. 17 is a schematic circuit diagram of a further embodiment of the output coupling network 45. This embodiment of the output coupling network 45 is suitable for use in embodiments where the PA 20 is adapted for operation in four frequency bands; in class IF in the first and third frequency band and in class F in the second and fourth frequency band. The embodiment can be seen as an extension of the embodiment illustrated in FIG. 15. The transmission lines 195, 200, 205, 210, 215, 220, 225, 285, 290, and 295 have the same purpose as in the embodiment illustrated in FIG. 15, and are not described in any greater detail in the context of FIG. 17. However, it can be noted that since $f_4$ is selected as $1.5f_3$, $2f_4=3f_3$. Therefore, the shorting out provided at $3f_3$ also yields a shorting out at $2f_4$ (since this is the same frequency).

In addition, the embodiment of the output coupling network 45 illustrated in FIG. 17 comprises transmission lines 310 and 315, both having a length of $\lambda/4$ at the frequency $3f_4$. These transmission lines are responsible for providing the desired blocking at this frequency. Furthermore, the output coupling network 45 according to this embodiment comprises a tuning line 320 (which in some sense can be seen as replacing the transmission line 190 in FIG. 15), the length of which is selected such that the tuning line 320 together with the transmission line 195 provides the desired open circuit at the frequency at the frequency $3f_2$.

Similarly to the embodiment of FIG. 15, the tuning lines 290 and 295, together with the tuning lines 220 and 225, are responsible for providing a proper impedance matching at the fundamental frequencies $f_1$, $f_2$, $f_3$, and $f_4$, and the lengths of these tuning lines are selected accordingly. Again, such impedance matching may, in some cases, be possible to obtain without the additional tuning lines 290 and 295. Whether or not this is the case can e.g. be determined by trial and error based on computer simulations using accurate models of the resistive load 55 and the transistor 35.

Figure 18:
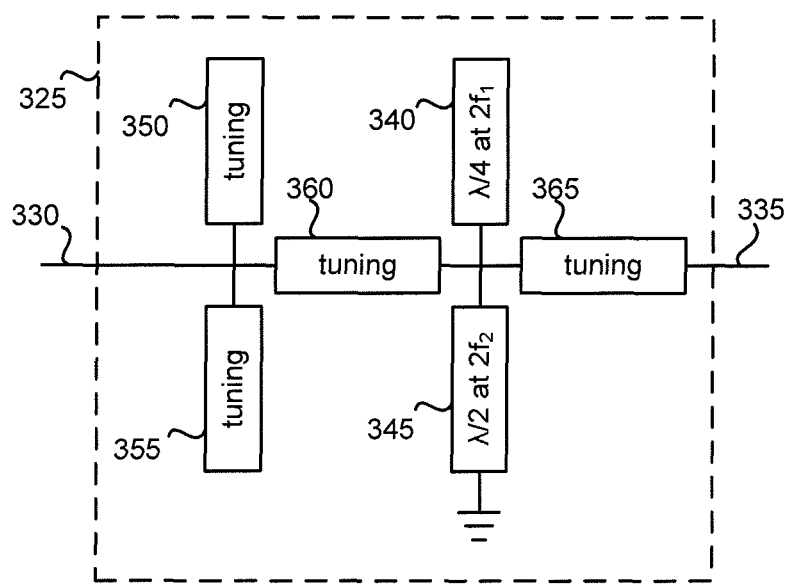
FIG. 18 is schematic circuit diagram of an input matching network according to an embodiment of the present invention.

A transistor, such as the transistor 35, in practice has a characteristic that deviates from an ideal switch. Therefore, in order to further improve the performance of the PA 20, e.g. in terms of PAE, the design of a proper input matching network may be considered as well in the design of the PA 20. FIG. 18 is a schematic circuit diagram of an embodiment of such an input matching network 325. The input matching network has an input terminal 330 and an output terminal 335. The input matching network may e.g. be included in the PA 20, connected between the input terminal 22 of the PA 20 and the gate of the transistor 35 (FIG. 3). Alternatively, the input matching network 325 can be seen as a component of the signal generation unit 15 (FIG. 2). The embodiment of the input matching network 325 illustrated in FIG. 18 is suitable for embodiments of the PA 20 adapted to operate in two frequency bands. This embodiment of the input matching network 325 comprises a transmission line 340 having a length of $\lambda/4$ at the frequency $2f_1$. Furthermore, this embodiment of the input matching network 325 comprises a transmission line 345, grounded at one end and having a length of $\lambda/2$ at the frequency $2f_2$. The transmission lines 340 and 345 are responsible for obtaining a proper input reactance at the second harmonics of $f_1$ and $f_2$, respectively. A tuning line 365 is included in this embodiment of the input matching network 325 and tuned to refine the phase of the harmonics, if necessary. Moreover, the embodiment of the input matching network 325 illustrated in FIG. 18 comprises tuning lines 350, 355, and 360, which are tuned to a proper impedance matching at the fundamental frequencies $f_1$ and $f_2$.

In the transmission-line realization of the output coupling network 45 presented in accordance with embodiments above, the output coupling network 45 can be considered as having two parts; one part responsible for harmonic termination and another part responsible for fundamental matching. In these embodiments, the part responsible for harmonic termination is located "first" (i.e. closest to the transistor) and the part responsible for fundamental matching is placed "last" (i.e. closest to the resistive load 55). This configuration has the advantage that the part responsible for the fundamental load does not affect the open/short terminations for the harmonics as seen from the side of the transistor 35.

Figure 19:
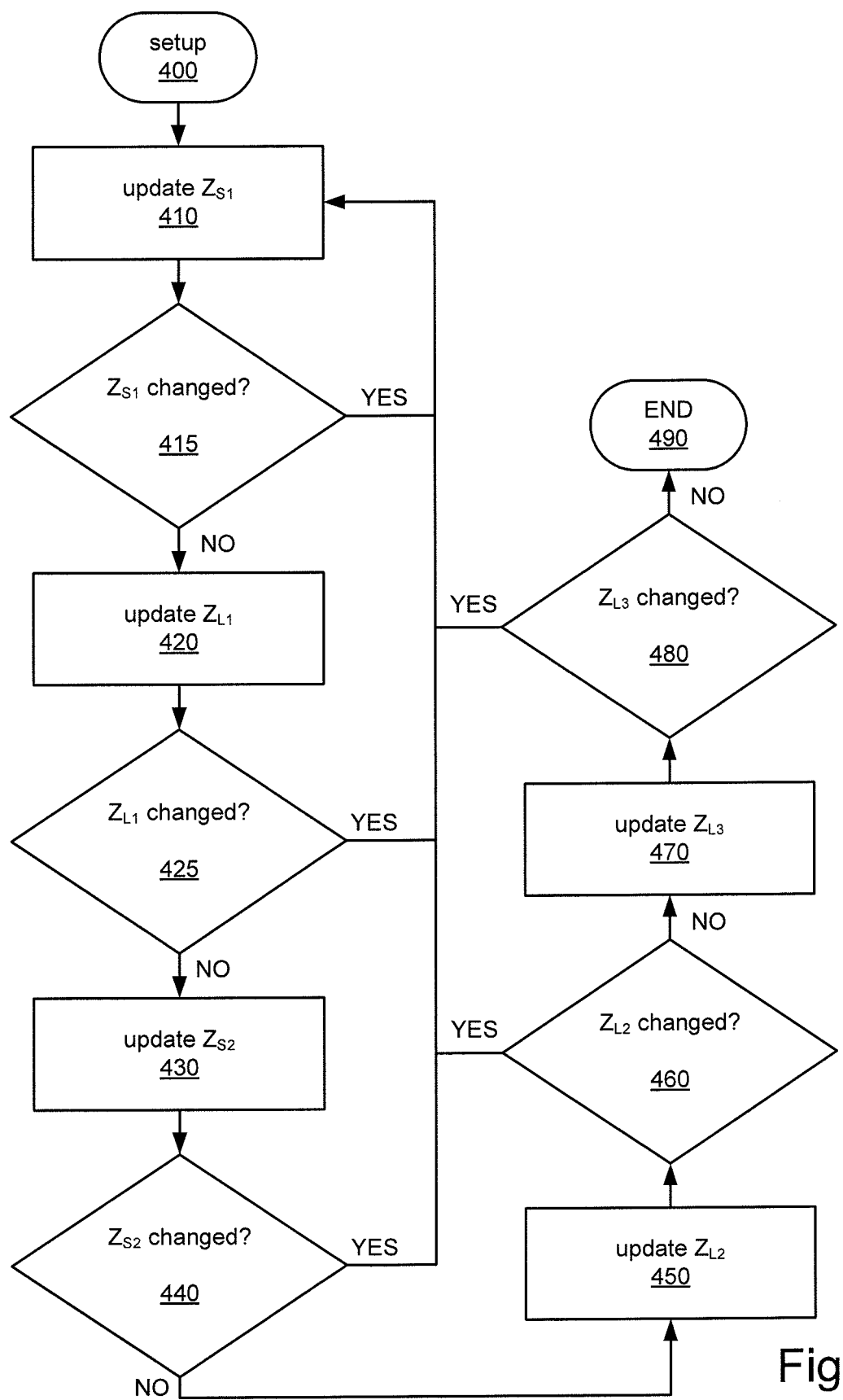
FIG. 19 is a flow chart for a design methodology for dimensioning of circuit components for embodiments of the present invention.

Selection, or tuning, of transmission line dimensions, e.g. for the tuning lines, can be performed based on computer simulation to obtain the desired functionality. This is typically an iterative process, as tweaking of the dimensions of one transmission line may require additional tweaking of the dimensions of other transmission lines. Also, nonideal properties of the transistor 35, e.g. in terms of parasitics and other properties that causes the transistor to deviate from an ideal switch, should be taken into account in the design process. FIG. 19 is a flow chart illustrating a work flow which is suitable for performing such tuning. The work flow is based on so called source-pull and load-pull simulations, and can be seen as an adaptation of the methodology presented in the article S. Gao et al, "High-efficiency power amplifier design including input harmonic termination", IEEE Microwave and Wireless Components Letters, vol. 16, no. 2, pp. 81-83, February 2005.

In FIG. 19, $Z_{S1}$ denotes the fundamental source impedance and $Z_{S2}$ denotes the second harmonic source impedance. Furthermore, $Z_{L1}$, $Z_{L2}$, and $Z_{L3}$ denote the fundamental load impedance, the second harmonic load impedance, and the third harmonic load impedance, respectively. For operation in class F, a theoretical optimum value of $Z_{L1}$ is $$Z_{L1} = \frac{8}{\pi^2} \cdot \frac{V_{DC}^2}{P_{out}}$$

and in class IF, a theoretical optimum value of $Z_{L1}$ is $$Z_{L1} = \frac{\pi}{4} \cdot \frac{V_{DC}^2}{P_{out}}$$

wherein $V_{DC}$ is the supply voltage and $P_{out}$ is the required output power. Compared with a class F amplifier, the waveform shapes of the drain voltage and current are swapped for a class IF amplifier. That is, the current waveform of a class IF amplifier corresponds to the voltage waveform of a class F amplifier, whereas the voltage waveform of a class IF amplifier corresponds to the current waveform of a class F amplifier. This is why the fundamental load impedance $Z_{L1}$ is different in class F than in class IF operation.

The work flow can be directed towards obtaining either a maximum PAE or a maximum $P_{out}$ as a goal of the optimization. Hence, the word optimum, when used below, can mean either a value that results in a maximum PAE or maximum $P_{out}$, depending on the goal of the optimization.

In step 400, the optimization procedure is set up by defining a biasing point, an RF frequency (i.e. fundamental frequency), and an input power. For the first iteration, $Z_{L2}$ is set to a short circuit and $Z_{L3}$ is set to an open circuit for class F. For class IF, $Z_{L2}$ is set to an open circuit and $Z_{L3}$ is set to a short circuit for the first iteration. Initial values of $Z_{S1}$ and $Z_{S2}$ can be determined using small-signal S-parameter simulations. The biasing point may be selected such that the drain-source voltage of the transistor 35 equals the supply voltage and the gate-source voltage of the transistor 35 equals the threshold voltage of the transistor 35.

In step 410, a small-signal method (S11) is used together with a fundamental source-pull simulation to update, or refine, the value of $Z_{S1}$ to an optimum value, while the other impedances are set to previously determined values. In step 415, it is determined whether step 410 has changed $Z_{S1}$ with more than a certain threshold value. If this is the case, the procedure returns to step 410. Otherwise, the procedure proceeds to step 420.

In step 420, a fundamental load-pull simulation is performed to update, or refine, the value of $Z_{L1}$ to an optimum value, while the other impedances are set to previously determined values. In step 425, it is determined whether step 420 has changed $Z_{L1}$ with more than a certain threshold value. If this is the case, the procedure returns to step 410. Otherwise, the procedure proceeds to step 430.

In step 430, a second harmonic source-pull simulation is performed to update, or refine, the value of $Z_{S2}$ to an optimum value (given the current values of the other impedances). In step 440, it is determined whether step 430 has changed $Z_{S2}$ with more than a certain threshold value. If this is the case, the procedure returns to step 410. Otherwise, the procedure proceeds to step 450.

In step 450, a second harmonic load-pull simulation is used to update, or refine, the value of $Z_{L2}$ to an optimum value (given the current values of the other impedances). In step 460, it is determined whether step 450 has changed $Z_{L2}$ with more than a certain threshold value. If this is the case, the procedure returns to step 410. Otherwise, the procedure proceeds to step 470.

In step 470, a third harmonic load-pull simulation is used to update, or refine, the value of $Z_{L3}$ to an optimum value (given the current values of the other impedances). In step 480, it is determined whether step 470 has changed $Z_{L3}$ with more than a certain threshold value. If this is the case, the procedure returns to step 410. Otherwise, the procedure proceeds to step 490, wherein the procedure is ended.

The procedure illustrated in FIG. 19 should be repeated for each frequency band in which the PA 20 is adapted to operate in. Once the proper impedance values have been determined from the multi-harmonic source-pull and load-pull simulations, the electrical lengths and characteristic impedances of the corresponding ideal transmission lines can be synthesized in a straightforward manner using known methods in the art of microwave circuit design. Then, the physical transmission-line dimensions can be calculated based on the realization of practical substrate and metal materials. As mentioned above, not only the dimensions of the transmission lines labeled "tuning lines" in the figures, but also the tuning lines indicated in the figures as having a certain length, can be subject to refinement in the iterative design process. Thus, the indicated certain lengths of such transmission lines can be seen as suitable start values.

The present invention has been described above with reference to specific embodiments. However, other embodiments than the above described are possible within the scope of the invention. For example, numerous other structures of the output coupling network, both concerning the part responsible for harmonic termination and the part responsible for fundamental matching, are possible within the scope of the invention. The different features of the embodiments may be combined in other combinations than those described. The scope of the invention is only limited by the appended patent claims.

The invention claimed is:

1. A power amplifier for operation in at least a first frequency band and a second frequency band, the power amplifier comprising:
  a transistor for amplifying an input signal of the power amplifier; and
  an output coupling network operatively connected to an output terminal of the transistor and having its own output terminal for connecting the power amplifier to a resistive load;
  wherein the output coupling network is configured such that, when the power amplifier is connected to the resistive load, the power amplifier is configured to:
    operate in class F for frequencies in one of the first frequency band and the second frequency band; and
    operate in inverse class F for frequencies in the other of the first frequency band and the second frequency band;
  wherein a center frequency $f_2$ of the second frequency band is higher than a center frequency $f_1$ of the first frequency band; and
  wherein a ratio between $f_2$ and $f_1$ is 1.5.

2. The power amplifier of claim 1:
  wherein the power amplifier is configured for operation in class F for frequencies in the first frequency band and for operation in inverse class F for frequencies in the second frequency band;
  wherein, when the power amplifier is connected to the resistive load, the output coupling network is configured to:
    provide an essentially lossless electrical connection between the output terminal of the transistor and the resistive load at the frequencies $f_1$ and $f_2$;
    provide an open circuit between the output terminal of the transistor and the resistive load at the frequency $3*f_1=2*f_2$; and provide a short circuit between the output terminal of the transistor and a reference voltage node at the frequencies $2*f_1$ and $3*f_2$.

3. The power amplifier of claim 2, wherein the output coupling network comprises:
a first parallel LC resonance circuit operatively connected between the output terminal of the transistor and the output terminal of the output coupling network, and configured to resonate at the frequency $3*f_1=2*f_2$ for providing the open circuit at $3*f_1=2*f_2$; and
a branch operatively connected between the output terminal of the output coupling network and the reference voltage node, comprising:
a second parallel LC resonance circuit; and
a third parallel LC resonance circuit, connected in series with the second parallel LC resonance circuit;
wherein the second parallel LC resonance circuit is configured to resonate at the frequency $f_1$ and the third parallel LC resonance circuit is configured to resonate at the frequency $f_2$ for providing the essentially lossless electrical connection between the output terminal of the transistor and the resistive load at frequencies $f_1$ and $f_2$ and for providing the short circuit between the output terminal of the transistor and the reference voltage node at the frequencies $2*f_1$ and $3*f_2$.

4. The power amplifier of claim 2, wherein the output coupling network comprises transmission lines configured to provide the essentially lossless electrical connection at the frequencies $f_1$ and $f_2$, the open circuit at the frequency $3*f_1=2*f_2$, and the short circuit at the frequencies $2*f_1$ and $3*f_2$.

5. The power amplifier of claim 1:
wherein the power amplifier is configured for operation in inverse class F for frequencies in the first frequency band and for operation in class F for frequencies in the second frequency band;
wherein, when the power amplifier is connected to the resistive load, the output coupling network is configured to:
provide an essentially lossless electrical connection between the output terminal of the transistor and the resistive load at the frequencies $f_1$ and $f_2$;
provide an open circuit between the output terminal of the transistor and the resistive load at the frequencies $2*f_1$ and $3*f_2$; and
provide a short circuit between the output terminal of the transistor and a reference voltage node at the frequency $3*f_1=2*f_2$.

6. The power amplifier of claim 5, wherein the output coupling network comprises:
a first series LC resonance circuit operatively connected between the output terminal of the transistor and a reference voltage node, and configured to resonate at the frequency $3*f_1=2*f_2$ for providing the short circuit at the frequency $3*f_1=2*f_2$; and
a branch operatively connected between the output terminal of the transistor and the output terminal of the output coupling network, comprising:
a second series LC resonance circuit configured to resonate at the frequency $f_1$; and
a third series LC resonance circuit, connected in parallel with the second series LC resonance circuit configured to resonate at the frequency $f_2$;
wherein the branch provides:
essentially lossless electrical connection between the output terminal of the transistor and the resistive load at frequencies $f_1$ and $f_2$; and provides the open circuit between the output terminal of the transistor and the resistive load at the frequencies $2*f_1$ and $3*f_2$.

7. The power amplifier of claim 4, wherein the output coupling network comprises transmission lines configured to provide the essentially lossless electrical connection at the frequencies $f_1$ and $f_2$, the open circuit at the frequencies $2*f_1$ and $3*f_2$, and the short circuit at the frequency $3*f_1=2*f_2$.

8. The power amplifier of claim 1:
wherein the power amplifier is further configured for operation in an additional third frequency band;
wherein a center frequency $f_3$ of the third frequency band is higher than the center frequency $f_2$ of the second frequency band; and
wherein the output coupling network is configured such that when the power amplifier is connected to the resistive load, the power amplifier is configured to operate in the same class for frequencies in the third frequency band as for frequencies in the first frequency band.

9. The power amplifier of claim 8, wherein a ratio between $f_3$ and $f_2$ band is 1.5.

10. The power amplifier of claim 8:
wherein the power amplifier is further configured for operation in an additional fourth frequency band;
wherein a center frequency $f_4$ of the fourth frequency band is higher than the center frequency $f_3$ of the third frequency band; and
wherein the output coupling network is configured such that when the power amplifier is connected to the resistive load, the power amplifier is configured to operate in the same class for frequencies in the fourth frequency band as for frequencies in the second frequency band.

11. The power amplifier of claim 10, wherein a ratio between $f_4$ and $f_3$ band is 1.5.

12. The power amplifier of claim 11:
wherein the power amplifier is configured for operation in class F for frequencies in the first frequency band and for operation in inverse class F for frequencies in the second frequency band;
wherein, when the power amplifier is connected to the resistive load, the output coupling network is configured to:
provide an essentially lossless electrical connection between the output terminal of the transistor and the resistive load at the frequencies $f_3$ and $f_4$;
provide an open circuit between the output terminal of the transistor and the resistive load at the frequency $3*f_3=2*f_4$; and
provide a short circuit between the output terminal of the transistor and a reference voltage node at the frequencies $2*f_3$ and $3*f_4$.

13. The power amplifier of claim 11:
wherein the power amplifier is configured for operation in inverse class F for frequencies in the first frequency band and for operation in class F for frequencies in the second frequency band;
wherein, when the power amplifier is connected to the resistive load, the output coupling network is configured to:
provide an essentially lossless electrical connection between the output terminal of the transistor and the resistive load at the frequencies $f_3$ and $f_4$;
provide an open circuit between the output terminal of the transistor and the resistive load at the frequencies $2*f_3$ and $3*f_4$; and provide a short circuit between the output terminal of the transistor and a reference voltage node at the frequency $3*f_3=2*f_4$.

14. The power amplifier of claim 1, wherein the power amplifier is included in a radio transmitter circuit.

15. The power amplifier of claim 1, wherein the power amplifier is included in a mobile phone.

16. The power amplifier of claim 1, wherein the power amplifier is included in a radio base station.

* * * * *